United States Patent
Alphonse

(10) Patent No.: US 9,158,057 B2
(45) Date of Patent: Oct. 13, 2015

(54) SEMICONDUCTOR LIGHT SOURCE FREE FROM FACET REFLECTIONS

(71) Applicant: Gerard A Alphonse, Princeton, NJ (US)

(72) Inventor: Gerard A Alphonse, Princeton, NJ (US)

(*) Notice: Subject to any disclaimer, the term of this patent is extended or adjusted under 35 U.S.C. 154(b) by 154 days.

(21) Appl. No.: 13/897,369

(22) Filed: May 18, 2013

(65) Prior Publication Data

US 2013/0308333 A1    Nov. 21, 2013

Related U.S. Application Data

(60) Provisional application No. 61/649,043, filed on May 18, 2012.

(51) Int. Cl.
| | | |
|---|---|---|
| F21V 8/00 | (2006.01) | |
| H01L 33/00 | (2010.01) | |
| H01S 5/10 | (2006.01) | |
| H01S 5/14 | (2006.01) | |
| H01S 5/50 | (2006.01) | |

(52) U.S. Cl.
CPC .......... *G02B 6/0073* (2013.01); *H01L 33/0045* (2013.01); *H01S 5/1003* (2013.01); *H01S 5/1064* (2013.01); *H01S 5/1085* (2013.01); *H01S 5/101* (2013.01); *H01S 5/1014* (2013.01); *H01S 5/14* (2013.01); *H01S 5/50* (2013.01)

(58) Field of Classification Search
CPC ..... H01L 33/32; H01L 33/20; H01L 33/0079; H01L 33/38; B82Y 20/00
See application file for complete search history.

(56) References Cited

U.S. PATENT DOCUMENTS

| | | | |
|---|---|---|---|
| 4,958,355 A | 9/1990 | Alphonse et al. | |
| 6,091,755 A | 7/2000 | Sanders et al. | |
| 6,339,606 B1 * | 1/2002 | Alphonse | 372/50.1 |
| 8,259,304 B2 | 9/2012 | Alphonse | |
| 8,269,977 B2 | 9/2012 | Alphonse | |
| 2007/0291805 A1 * | 12/2007 | Ledentsov et al. | 372/38.01 |
| 2008/0018988 A1 * | 1/2008 | Davidson | 359/341.1 |
| 2010/0238962 A1 * | 9/2010 | Oh et al. | 372/45.01 |
| 2012/0146068 A1 * | 6/2012 | Groom et al. | 257/94 |

OTHER PUBLICATIONS

"Low spectral modulation . . . Superluminescent diode/ optical amplifier structure", Alphonse et al., Applied Physics Letters vol. 55 (22), Nov. 1989, pp. 2289-2291.
"Superluminescent Diodes with Bent Waveguide", Lin et al. IEEE Photonics Technology Letters vo. 8, (2), Feb. 1996, pp. 206-208.

* cited by examiner

*Primary Examiner* — Michael Jung
*Assistant Examiner* — Charles R Peters
(74) *Attorney, Agent, or Firm* — Sonali Banerjee

(57) ABSTRACT

A new class of optical source having a truncated waveguide is provided, where a guided section of a light generating medium is terminated at an angle at a predetermined distance away from one end facet of the waveguide, thereby leaving a section for unguided light propagation. A truncated waveguide when implemented in combination with waveguide tilt, effective front facet reflectivity is reduced significantly to eliminate unwanted facet reflections. By extending electrical pumping in the unguided propagation section, the light in the unguided path propagates to a corresponding end facet without attenuation. The reflected light propagates freely without being intercepted by the waveguide. The principles are incorporated in different types of light generating and amplifying medium including a "double-pass" gain medium for designing optical sources having significantly high output power and negligibly small spectral modulation arising from unwanted facet reflections.

24 Claims, 14 Drawing Sheets

SEMICONDUCTOR LIGHT SOURCE FREE FROM FACET REFLECTIONS

CROSS REFERENCE TO RELATED APPLICATION

This application seeks priority from the U.S. Provisional Application No. 61/649,043 filed on May 18, 2012.

BACKGROUND OF THE INVENTION

1. Field of the Invention

This invention is in the field of optical source and in particular, in the field of high optical power broadband optical sources free of facet reflections over an extended bandwidth.

2. Description of the Related Arts

Optical sources and in particular high power optical sources having a broad spectral width, are key components in improving performance of many applications such as, OCT (optical coherence tomography), IFOG (interferometric fiber optic gyroscope), high-power illumination, optical sensing, optical spectroscopy, to name just a few. Often times, semiconductor optical sources are preferred for such applications for their low drive current, efficiency and small footprint. A conventional broadband semiconductor light emitting device for example, a Light Emitting Diode (LED) provides very low output power and is not suitable for many of these applications. Alternative edge emitting semiconductor light-generating and amplifying devices, such as Super Luminescent Diodes (SLD) provide higher power output but have a smaller bandwidth. Although these devices may be operated at a high gain, often times spectral quality and in particular, spectral modulation puts a practical limit on the output power.

Most semiconductor optical sources comprise a waveguide structure extending between two parallel end facets, and include a p-n double hetero junction constructed from multiple layers of semiconductor materials of appropriate thickness and composition, on a semiconducting substrate. Light from such an edge emitting device propagates at one or both end facets depending upon the reflectivities of the two end facets. For a waveguide structure to provide a high output power, it needs to be operated at a drive current high enough to produce optical gain in the waveguide medium. However, operating the device at high gain also reduces the bandwidth.

In the past, different waveguide designs have been explored for achieving higher output power from a waveguide light source. In a non-patent literature publication entitled "Low spectral modulation high-power output from a new AlGaAs Superluminescent diode/optical amplifier structure", authored by Alphonse et al. and published in Applied Physics Letters vol. 55 (22), November 1989, pp. 2289-2291, a light source having a tilted waveguide structure is disclosed to exhibit higher output power. A similar design for a SLD is disclosed in the U.S. Pat. No. 4,958,355 issued on Sep. 18, 1999 to Alphonse et al. A tilted waveguide design for this device allows operation at a high gain level without lasing by reducing reflectivity at the end facets of the waveguide. The resulting source provides about 20 mW (milli Watt) of output power, and a spectral modulation of about 1%. While this device may be adequate for certain applications, spectral modulation may still be a limiting factor for applications requiring significantly higher power.

In a different design disclosed in the U.S. Pat. No. 6,339,606 issued on Jan. 15, 2002, to Alphonse, a diamond waveguide structure including multiple tapered sections is disclosed (FIGS. 6 & 7). In this structure the waveguide extended between the two end facets is expanded in the center to achieve higher output power. By placing the waveguide at an angle with respect to one or both end facets, higher output power and low spectral modulation is expected from such a device. However, when operated at high drive current to achieve high output power, the facet reflectivity still contributes significant amount of spectral modulation and reduction in the bandwidth, thereby limiting the utility of such source as a broadband source.

Edge emitting semiconductor optical sources having even high output power and enhanced bandwidth are disclosed in the U.S. Pat. Nos. 8,269,977 and 8,259,304 issued on Sep. 18, 2012, and Sep. 4, 2012, respectively, both to Alphonse. The disclosures of the above mentioned patents are hereby incorporated by reference, in their entirety. More specifically, the optical sources described therein comprise a Semiconductor Optical Amplifier (SOA) and Super Luminescent Diodes (SLD) having a waveguide, and in particular a ridge waveguide disposed between two etched channels at a small angle with respect to end facets of the guiding region.

One important design aspect of said broadband sources is to provide different optical coatings having predetermined reflectivity profile for example, antireflection, raised-edge reflectivity, etc. at the two end facets, resulting in high optical power and extended bandwidth that surpass emission from a SOA or a SLD alone. However, spectral profile of said optical sources exhibits a discrete set of emission lines resembling teeth of a comb. While this type of source is beneficial for certain applications (e.g. OCT), it may not be useful for other applications where a broad spectral profile source having high output power and low spectral modulation is preferable (e.g. IFOG).

SUMMARY OF THE INVENTION

In this invention, a new class of optical sources is provided. The new optical sources may be constructed from a semiconductor waveguide structure or dielectric waveguide structure such as optical fiber. The new sources may be operated at higher gain and therefore deliver higher output power, exhibit enhanced bandwidth and a smooth spectral profile free of facet reflections, as compared to light emission from a prior art SOA and SLD.

One objective of the present invention is to provide a new class of optical source that would generate higher output power over an extended bandwidth as compared to prior art optical sources using a SOA or SLD devices. Advantageously, the output spectrum of the new class of optical sources according to this invention is free from spectral modulation. According to this invention, the reflectivity of at least one of the reflective surface of the new optical source is substantially reduced, preferably by several orders of magnitude below what is achievable by either tilting a waveguide at an angle with respect to a normal to an end facet, and/or providing one or more antireflective coatings.

In one embodiment of the invention an optical source comprising a semiconductor waveguide structure is provided. The waveguide structure includes a ridge between two end facets, the ridge being formed by etching away channels in its surrounding material to a prescribed depth. The light in the waveguide is confined in the ridge due to the slightly lower refractive index in the region surrounding the ridge in the lateral direction, and by current confinement in the vertical direction. In a preferred embodiment the waveguide is tilted at predetermined angles with respect to one or both end facets.

In another aspect of the invention the ridge waveguide structure is tilted at an angle with respect to an end facet and is truncated to provide an unguided region near the end facet, to achieve a desired reflectivity profile at the end facet. The reflectivity in this type of waveguide structure may be made negligibly small such that the spectral profile of the output emission is almost free of modulation caused by reflection from the facet.

In one aspect of the invention, the waveguide structure with at least one tilted end truncated at a short distance from the tilted end is provided with predetermined reflectivity profiles so as to operate the optical source at high gain having a broad spectral profile and negligibly small spectral modulation. In another aspect, same source may be configured with an external reflector placed at a predetermined distance from an angled and truncated waveguide facet such as to increase the optical length of the source while avoiding cavity effect caused by facet reflection.

In another embodiment of the invention, the waveguide region may be constructed as a curved structure having one end perpendicular to a corresponding end facet, the curvature being such that the other end is tilted at a predetermined angle at the corresponding facet. The reflectivities of the end facets are adjusted so as to operate the optical source with a broad spectral profile. In a preferred embodiment the waveguide region may be truncated or terminated at one end, preferably near the tilted waveguide end, to provide a very low reflectivity at that end facet. The facet reflectivity is determined by the waveguide tilt angle and the truncation distance defined to be the distance between the truncated end of the waveguide and the corresponding end facet.

In one aspect of the invention, reflectivity at a tilted end facet of the waveguide having waveguide truncation may be further reduced by providing antireflective coatings on the facet such that the spectral profile of the output emission is free of facet reflections. Advantageously, an external reflector having a desired reflectivity profile, such as for example a raised-edge reflectivity profile, to provide for extending the bandwidth beyond the available bandwidth of the semiconductor medium.

In a different embodiment of the invention a light source having broad spectral profile is provided with a truncated tilted waveguide structure. The waveguide is truncated at both ends to configure a SLD/SOA structure exhibiting significantly lower spectral modulation than the state-of-the-art counterpart device. In a variant embodiment, a discrete spectrum light source is provided using a truncated waveguide structure as a gain medium in an external cavity source to eliminate spurious discrete lines from the due to significant reduction in the reflectivity at the back facet of the waveguide gain medium.

In one variation of the invention, a double-pass light source is provided by using a curved semiconductor waveguide which is perpendicular to the back facet at one end, and is disposed at an angle. The waveguide is truncated at the facet corresponding to the angled end such that the output is proportional to the square of the semiconductor gain, thus effectively achieving a very efficient high-power SLD.

In another variation of the invention, a double-pass semiconductor optical amplifier (SOA) is provided by using a double-pass source in combination with external peripheral components, such as a three-port circulator, to provide a high-gain two-port optical amplifier that is free from feedback reflection.

In other embodiments special waveguide design is provided to operate optical sources at very high output power without facet damage. Special waveguide design includes a truncated flare waveguide and a truncated diamond waveguide structure that provides higher output power, negligible spectral modulation and facet damage.

BRIEF DESCRIPTION OF THE DRAWINGS

Principles of the invention may be incorporated to configure optical sources in one or more embodiments. A wide framework of the invention may be better understood in view of different aspects shown in one or more embodiments that may be practiced alone or in combination with aspects shown in other embodiments that may be represented by drawing figures in which.

DETAILED DESCRIPTION OF THE INVENTION

Basic Design Principles:

A broad framework of the invention will be described in view of most widely understood and widely used prior art broadband light generating and amplifying devices namely, Super Luminescent Diode (SLD), and/or Semiconductor Optical Amplifier (SOA), so that those skilled in the art will be able to understand distinguishing features of the new optical sources configured according to the principles of this invention. Specific embodiments and material systems described for explaining the principles of this invention are merely exemplary and should not be construed to be limited to semiconductor gain medium, or to semiconductor waveguide structures. Other gain media and guiding structures may suitably be adapted for constructing sources using the same principles by those skilled in the art. All such combinations and sub-combinations are within the broad framework of the principles of this invention and are therefore implicitly included in this disclosure.

Figure 1:
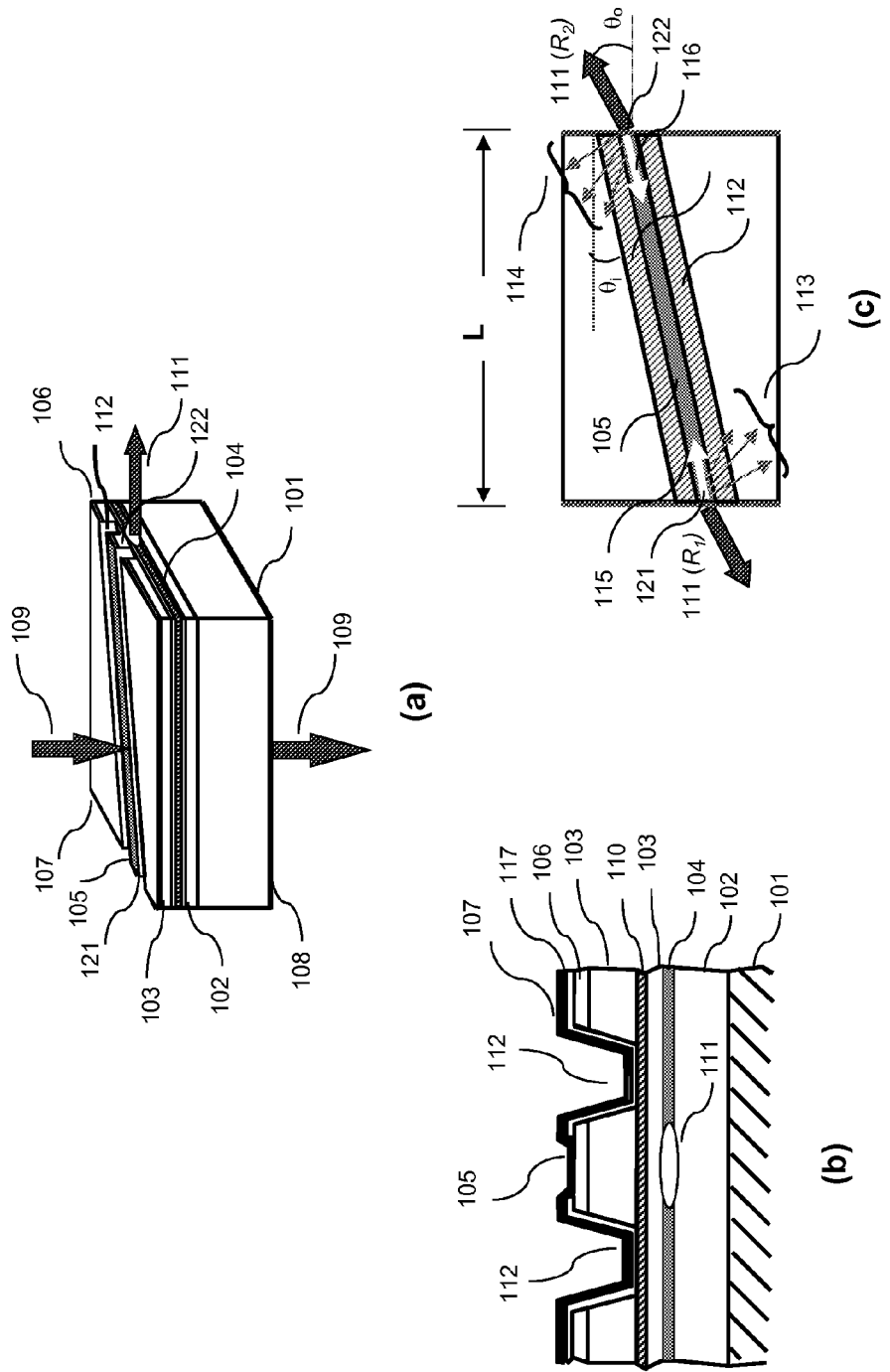
FIG. 1 shows a prior art ridge waveguide SOA structure: a) a perspective view, b) top view of a waveguide tilted at an angle with respect to the facets, and c) a projection view at an edge showing layers of the waveguide structure.

Referring now to FIG. 1, there it shows basic tilted waveguide structure commonly used to construct a prior art broadband semiconductor optical source, for example a SLD, etc., typically configured as a two terminal device very similar to the one disclosed in the U.S. Pat. No. 4,958,355 issued on Sep. 18, 1999, to Alphonse et al. For ease of discussion, a semiconductor optical source is chosen to illustrate the principles. However, same description applies to other types of two terminal light sources as well.

In FIG. 1, a perspective view of an exemplary structure is shown. More specifically, the light source, for example a SLD comprises a waveguide (or a waveguide chip), typically including multiple layers of material constructed on a substrate 101. A commonly used waveguide has two end facets, and the planes of the facets are substantially perpendicular to the plane of the substrate whereas, the linear axis of symmetry of the waveguide is substantially parallel to the plane of the substrate.

Referring simultaneously to FIGS. 1a and 1b, a semiconductor waveguide chip may be grown on n or p-doped single-crystal semiconductor substrate by epitaxial growth of various layers comprising the chip. In this illustrative example, the substrate 101 is n-doped. While the structure is described using particular doping types for different layers, the description is only meant to be illustrative and should not be construed to be limiting. The layered structure may be better understood from the cross-section view looking from one of the facets, as shown in FIG. 1b. An n-type contact layer 108 is disposed at one surface of the substrate that serves as one terminal of the device.

For illustrative purposes, following convention well known in the industry is adopted; an electrical contact layer deposited on the bottom side of the substrate is referred as the bottom end of the device. Each subsequent layer is deposited sequentially on the surface distal to the electrical contact layer and the final layer distal to the substrate is referred as the top end of the device. An n-doped cladding layer 102 grown on the substrate supports an un-doped active layer 104 which includes a light generating material for example, a semiconductor layer, a p-n or a p-i-n homojunction or a heterojunction, a single or multiple quantum well structure, a graded index quantum well structure (e.g., GRINSCH), a quantum dot layer separated by appropriate thin buffer layer(s), etc. that are well known in the art as light generating materials and in particular, semiconductor materials exhibiting electroluminescence. A p-doped cladding layer 103 including an etch-stop layer 110 at a specified depth is disposed on top of the active layer thereby creating a p-i-n junction. The etch-stop layer is included to prevent chemical or dry etching to occur beyond that particular layer and is well documented in the art.

The waveguide chip comprises a ridge 105 which is created by selectively etching channels 112 (only one labeled for clarity in this view) along both lateral sides of a thin strip defined on a multilayer semiconductor structure. The waveguide ends are tilted at a small angle with respect to the end facets 121 and 122, respectively. The channels comprise etched regions in the p-clad region 103 to a depth specified by the location of an etch-stop layer 110, which is a thin layer of a material that is insensitive to the chemical used for etching the channels. In order to provide a low resistivity electrical contact, a very thin layer of heavily doped $p^+$-cap layer 106 is deposited over the p-doped cladding layer. The $p^+$-cap layer prevents formation of "Schottky Barrier" which would otherwise reduce the current flow.

To operate the device as a two terminal light source, an electric current is set up to flow from the p-region to the n-region only through the ridge. In order to ensure that the current flows only in the ridge, the whole surface of the device is covered with a layer of a dielectric insulating material 117, and the portion of the dielectric over the ridge is chemically etched to selectively expose the semiconductor surface for electrical contact. The whole surfaces on top of the p-side and the bottom of the n-side are metalized, so that electrodes 107 and 108 making electrical contact to the p- and n-sides of the device, respectively, may be placed anywhere on corresponding top and bottom surfaces. However, electric current only flows in the ridge where the dielectric layer is removed. Upon application of a voltage between the electrodes 107 and 108 shown by the heavy arrow 109 (in the vertical direction in FIG. 1a), the p-n junction under the ridge is biased in the forward direction. The light output looking from the facet emerges as an elliptic spot 111 (FIG. 1b).

It is known that the effective refractive index of a layered structure is a function of the refractive indices of the layer materials and their thicknesses. Since most of the p-clad in the channels is replaced by an air space with lower refractive index than the p-clad in the ridge, the effective index in the channels is lower than the effective index in the ridge. As a result of the index difference between the ridge and the channels provide a light guiding in the ridge, whereby light generated in the structure is confined in the lateral direction (in horizontal plane of the device), and is propagated only along the long axis of the ridge in this example.

In addition, material compositions for both the cladding layers are carefully selected such that the cladding layers have a slightly lower refractive index than the active layer, so as to confine the light in the vertical direction as well (with respect to the plane of the paper), to propagate only in the plane of the active layer. The ridge is essentially a waveguide structure similar to an optical fiber in which the core is the portion of the active region under the ridge and the clad is represented by the cladding layers in the vertical direction and by the etched channels in the lateral direction.

The electrical current flowing in the active layer in the junction region under the ridge generates photons by spontaneous emission due to recombination of injected electrons in the conduction band with holes in the valence band. The photons propagating in the waveguide may be able to cause additional electron-hole recombination to generate additional photons by stimulated emission. Under stimulated emission condition, the device exhibits optical gain because a single spontaneously emitted photon can stimulate the emission of several more photons cumulatively, as it travels along the waveguide between the end facets.

In the absence of any external input signal, light is emitted throughout the active layer and propagate in all directions, but only those generated at the end facets and propagating along the linear axis of the waveguide, are subjected to repeated reflection contributing towards amplified stimulated emission (ASE). Therefore, under sufficient current pumping, the device may be used as a light source with significant output power. The bandwidth of the amplified spontaneous emission output is a few percent of the bandgap wavelength, typically of the order of 24 nm to 30 nm for a source operating at about 840-nm, for example.

It is recalled that in general, semiconductor end facets exhibit a finite reflectivity, namely that the reflectivity is not zero at the end facets. Therefore a finite fraction of the light generated in the waveguide region, would be reflected from both ends and may propagate back in the waveguide. Hence the waveguide in conjunction with the reflective end facets, comprise a reflective cavity, similar to a Fabry-Perot cavity. As a consequence, the output spectral profile of the broadband ASE emission exhibits a certain amount of modulation superimposed on the spectral profile which manifests as a series of maxima (reinforcement) and minima (cancellations) at wavelengths corresponding to in-phase or out-of-phase round trip propagation. The strength of the modulation is a function of feedback determined by the optical gain in the waveguide medium, and the reflection coefficients at the end facets.

As such, the device inherently exhibits optical gain in the waveguide region that will also be referred as a gain medium hereinafter. In the absence of reflection at the end facets, if an external light input of power $P_i$ at a wavelength corresponding to the bandgap of the semiconductor comprising the gain medium, is injected at one end of the waveguide, it will be amplified and the output power $P_o$ exiting at the other end will be given by $P_o = P_i G$, where G is the optical gain in the active region. As will be described later, the device may be configured as different types of light sources for example, as a single-wavelength laser, a SLD, a SOA, a discrete spectrum light source (comb light source), or a gain medium to configure an external cavity device with different properties, by carefully adjusting the optical gain in the gain medium and the reflectivities at the two end facets, as will be apparent from the following discussion.

Referring now to FIG. 1c, there it shows a top view of the waveguide chip having a length 'L' including the ridge 105 and the two channels 112 that are disposed inclined at an angle $\theta_t$, with respect to the end facets 121 and 122, respectively. Hereinafter, the right hand facet 122 will be referred as the front (end) facet, and the left hand facet 121 will be referred as the back (end) facet of the waveguide. It is also conventional to assume that the reflection coefficient of the front facet is set to be substantially lower than that of the back facet, such that light from the optical source is emitted from the front facet. While the above convention will be followed to explain the basic principles of the invention, it can be appreciated by those skilled in the art that these are not the only choices.

Light is emitted in the outside space at both back and front facets shown by heavy arrows 111(B) and 111(F), respectively. It should be noted that the convention adapted here is merely for illustrative purposes and should not be construed as the only possibility. Since the refractive index of the semiconductor is higher than that of air/space, the output angle $\theta_o$ is larger than $\theta_t$ and according to the Snell's law, is expressed as $\sin \theta_o = n_e \sin \theta_t$, where $n_e$, is the effective index of the waveguide. The reflection coefficient, to be referred as R hereinafter, at the semiconductor-air interface, is given by $(n_e-1)^2/(n_e+1)^2$. It is also equal to the reflection coefficient (or reflectivity) for light to reflect back into the waveguide, when the waveguide is positioned perpendicular to the end facet, i.e., when $\theta_t=0$ or when light strikes on the end facet at a normal incidence.

However, due to the refractive index difference between the semiconductor and the outside air/space, a portion of the light is reflected at each facet. The amount of light reflected is determined by the back and front facet reflection coefficients (or reflectivities) $R_1$ and $R_2$, respectively. It is recalled that the light transmitted out of the waveguide as well as the light reflected back into the waveguide, spread into a narrow cone due to diffraction. The angle (in radians) of the cone is determined approximately by the ratio of the wavelength of the light to the width of the waveguide, which in this exemplary device is the width of the ridge. The diffraction spread of the reflected light is indicated by the small arrows collectively shown as 113 and 114, respectively near the back and front facets, respectively, in FIG. 1c.

Most of the reflected light is centered at an angle equal and opposite to the angle $\theta_o$, with respect to the facet normal. A portion of the reflected light at both facets indicated by heavy white arrows 115 and 116, respectively, that lie within the acceptance angle of the waveguide would propagate back in the waveguide in respective backward directions. For $\theta_t \equiv 0°$, most of the light reflected at the facet would be captured back into the waveguide, for example in a laser diode. However, for $\theta_t \geq 5°$, only a small fraction of the reflected light is captured back into the waveguide. Therefore, different types of light sources may be configured by carefully selecting the angle at which the waveguide is terminated, as well as by adjusting the reflectivities of the end facets.

In order to more clearly understand different modes of operation of the exemplary structures shown in FIG. 1a-1c, reference is made to U.S. Pat. Nos. 8,269,977 and 8,259,304 issued on Sep. 18, 2012, and Sep. 4, 2012, respectively, both to Alphonse. The disclosures of the above mentioned patents are incorporated by reference in their entirety. There it is disclosed that the output power spectrum at the front facet having a reflection coefficient $R_2$ is given by—

$$P_{Dout} = P_{SP}\left[\frac{(G-1)(1-R_2)(R_1 G+1)}{1+K^2-2K\cos\frac{4\pi n_e L}{\lambda}}\right] \quad (1)$$

where $K=G\sqrt{R_1 R_2}$, is valid for K<1.

In the above expression, $\lambda$ is the wavelength of the light, $n_e$ the effective refractive index of the waveguide, and $P_{SP}$ is the spontaneous emission light, typically of the order of 0.002 to 0.003 milliwatt (mW). The quantity K is called the "feedback factor" which is proportional to the gain 'G' and the square root of the product of the front and back reflectivities, $R_2$ and $R_1$, respectively. The value of the feedback factor determines the configuration of the device that can be obtained from the structure. This same equation would describe the output from the back facet by interchanging $R_1$ and $R_2$. It is recognized that the gain G is not a uniform function, but in fact has a spectral distribution which can be more specifically written as $G(\lambda)=G_o S(\lambda)$, where $S(\lambda)$ is approximately a Gaussian spectrum. Since the quantity in the brackets is dimensionless, it can be considered as the effective gain of the device when feedback is present, and its value is reduced to just G if there is no feedback, i.e., if the reflectivities $R_1$ and $R_2$ are zero.

Figure 2:
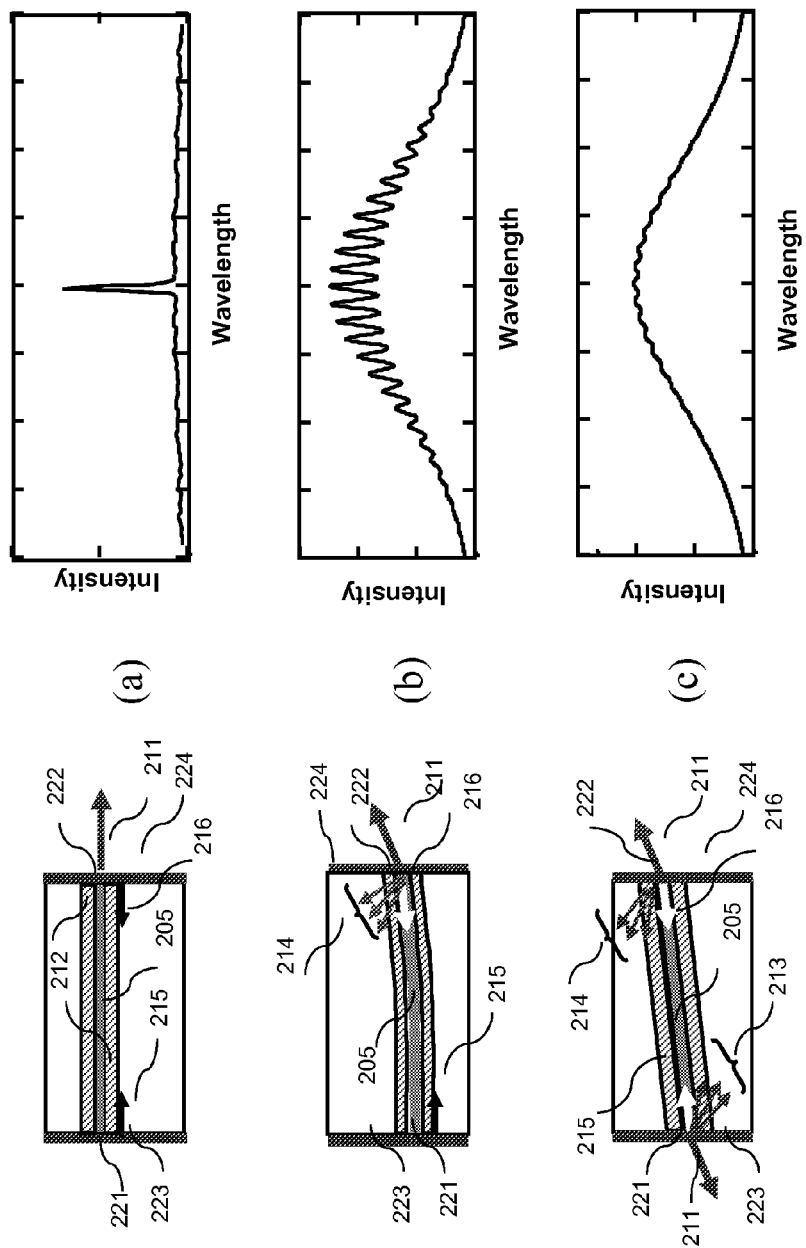
FIG. 2 shows different waveguide structures and respective optical emission spectral profiles: a) straight waveguide structure showing narrow linewidth spectral profile, b) curved waveguide structure showing broad spectral profile including spectral modulation, and c) tilted waveguide structure showing broad spectral profile having low spectral modulation.

More specifically, FIGS. 2a-2c shows three different waveguide chip structures on the left that may be used to configure optical sources. Elements having similar or equivalent functions are labeled with same reference numerals for ease of description and to avoid repetition. Corresponding spectral profiles of light emitted from each configuration is shown on the right. FIG. 2a is a configuration that operates as a laser. Since high reflectivities are desired, the waveguide comprising a ridge 205 positioned between the channels 212 is aligned perpendicular to both back and front facets 221 and 222, respectively. The end facets have reflectors for example dielectric mirrors 223 and 224, respectively, typically comprising optical coatings having moderate to high reflectivity, such that photons generated in the gain region are reflected back repeatedly into the waveguide in opposite directions indicated by heavy arrows 215 and 216, respectively.

In order to optimize output power the back facet is coated for reflectivity $R_1$ to be higher (typically 0.9) than the front facet reflectivity $R_2$ (typically 0.1). In this case, the feedback factor K is unity for G=3.33 and the quantity in the bracket in Eq. 1 goes to infinity at that value of the gain. The value of drive current which makes K=1 is called the laser threshold, and according to laser theory, the output power appears as a single high-power narrow-band line that is proportional to the drive current. The spectral profile (intensity vs. wavelength) of the light 211 emitted from the device exhibits a single wavelength with high OSNR (optical signal-to-noise ratio) and narrow linewidth, as shown in FIG. 2a.

FIG. 2b shows a configuration in which the ridge 205 is perpendicular to the back facet 221 but is curved such that it is inclined at a small angle with respect to the front facet 222. In prior art device described in the U.S. Pat. No. 6,091,755 issued on Jul. 18, 2000, to Sanders et al. a similar waveguide extending to both end facets is used as a gain medium for configuring a tunable external cavity laser. More specifically, light output from the angled facet is applied to an external Bragg grating which spatially disperses the spectral components of the light. A particular wavelength component of the dispersed spectrum may be selected as the reflective input for use in a tunable external cavity laser. A device using a bent waveguide extending all the way to the facet, operated as an SLD or SOA at a low drive current is shown to exhibit low spectral modulation as disclosed in a non-patent literature publication entitled "Superluminescent Diodes with Bent Waveguide", authored by Lin et al. and published in the IEEE Photonics Technology Letters vo. 8, (2), February 1996, pp. 206-208. However, the same device when operated at high drive current to achieve higher gain, exhibits significantly high spectral modulation and reduction in bandwidth.

The curved waveguide structure is also disclosed in the U.S. U.S. Pat. Nos. 8,269,977 and 8,259,304 issued on Sep. 18, 2012, and Sep. 4, 2012, respectively, both to Alphonse. There it is disclosed that a curved waveguide may be configured to function as a discrete spectrum broadband source, when the waveguide is positioned at an angle of 5 to 6 degrees with respect to the normal to the front facet 222 and is perpendicular to the back facet 221. Practical SOA can be made by operating with a gain of 500 to 1000 (27 dB to 30 dB). Ideally, the front facet reflectivity $R_2$ should be as small as possible. Due to practical limitations, it is of the order of $10^{-4}$ to $10^{-6}$ if the effect of the tilt angle is supplemented by antireflection coating.

The discrete spectrum source in the above mentioned patents utilizes the fact that spectral profile for such a configuration exhibits some spectral modulation as shown in the spectral profile shown in FIG. 2b. Therefore this configuration is limited for a SOA or SLD due to the spectral modulation, except when operated at low gain. More specifically, the spectral modulation m is expressed as—

$$m = \frac{\max - \min}{\max + \min} = \frac{2K}{1 + K^2} \quad (2)$$

In the spectral profile shown in FIG. 2b, the spectral modulation is about 20%. For a typical curved waveguide device where $R_1 = 0.1$, $R_2 = 10^{-5}$, this level of modulation would be reached at a relatively low gain of about 100, and the SLD output would be only about 3 mW. Reducing the modulation to about 4% would require the gain to be about 20, with an SLD output power of 0.12 mW. As such, it is not useful as an SLD or SOA. When the device is configured as tunable laser, the spectral modulation would be manifested as a spurious background. Reducing the gain to lower the spurious modes would result in a low power laser. Higher power and lower spectral modulation would be achievable with much lower values for $R_2$, but that is not possible with the angled waveguide design alone.

FIG. 2c shows a tilted waveguide structure that may be used to configure a SLD or SOA in which, the waveguide 205 is a straight waveguide disposed at an angle with respect to both facets 221 and 222 of the chip. Its corresponding spectrum is also shown. For this configuration, the output power for a SLD or SOA configuration would be about 6 mW with a 4% spectral modulation, when the back and front facet reflectivities $R_1 = R_2 = 10^{-5}$, and the gain is 2000. Those skilled in the art would be able to recognize that for applications that require higher output power and a smooth spectral profile for applications such as OCT, IFOG etc., current design for optical sources with a tilt angle of 5-6 degrees together with some antireflection coating on the end facets, are severely limited.

Design for Reflection Free Facet:

It should be noted that in order for a light source to emit at high output power, the light emitting medium must be operated at a drive current such that the light generating medium exhibits optical gain and is single-moded. Referring back to Eq. (1) and Eq. (2), it is noted that if G>>1 and $R_2$~0, the feedback factor K would be zero, and so would be the modulation index. If, in addition $R_1$~0, as it would be approximately for an angled-waveguide optical source (for example, a SLD) the output power would be a modulation-free spectrum given by—

$$P_{out} = P_{SP}(G-1) \approx P_{SP}G \quad (3)$$

The straight waveguide structure disposed at an angle will be referred as a "single-pass" SLD because the output is the amplified spontaneous emission going once through the waveguide. The single-pass SLD is not very efficient because equal power is emitted from the front and back facets. The output power of an optical source with the waveguide perpendicular to the back facet and angled at the front facet such that $R_2$~0 would also be modulation-free regardless of the value of the back reflectivity $R_1$, and the power would be given by—

$$P_{out} = P_{SP}(G-1)(R_1G+1) \approx P_{SP}R_1G^2 \quad (4)$$

The curved waveguide structure with near zero front facet reflectivity $R_2$, will hereinafter be referred to as a "double-pass" SLD, because the factor $(R_1G+1)$ corresponds to the backward propagating wave after being reflected from the back facet. In this configuration the output is effectively proportional to the square of the gain, which makes it a very efficient source, more efficient than the single-pass device by a factor equal to $R_1G$. From this discussion it may be inferred that an optical source for example, an SLD having a very high output power and negligible spectral modulation may be achieved by reducing the front facet reflectivity to zero, or practically eliminating, as will be described shortly.

While the following discussion is presented using an example of a ridge waveguide for simplicity, the discussion applies to any waveguide structure having an index of refraction step between the center region and the lateral regions, and the index step may be a real number, a complex number having a real and imaginary component, or a purely imaginary number (having no real part). The imaginary component of any complex number is represented by the symbol "i" or "j" whose value is the square root of −1.

Figure 3:
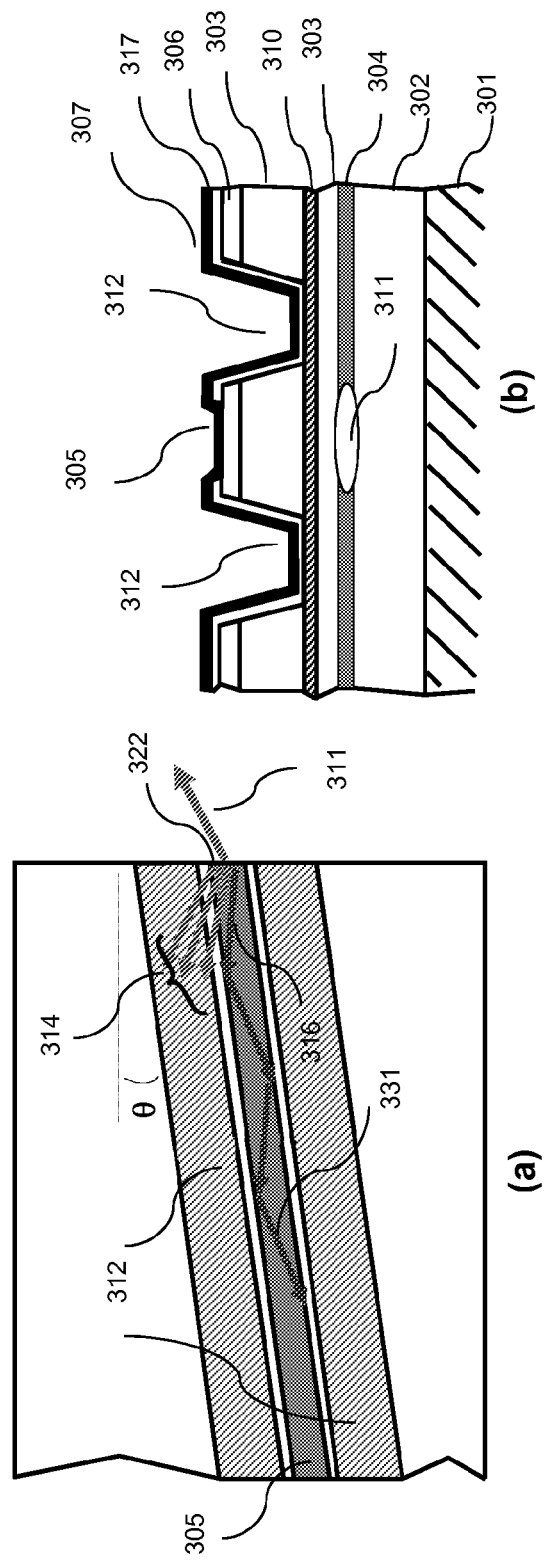
FIG. 3 is a schematic representation of: a) a projection view at a facet edge showing layers of waveguide structure, and b) propagation of light in by total internal reflection showing partial trapping of light at an end facet.

FIG. 3 shows a chip structure very similar to the ones shown in FIGS. 2b and 2c. More specifically, a schematic shown in FIG. 3a is an expanded view of a waveguide angled at the front facet for example. FIG. 3b shows a cross section view of the tilted waveguide depicting all the layers that comprise the entire structure. The structure is substantially similar to that described in reference with FIG. 1b and that description will not be repeated for brevity. More specifically, the waveguide shown in FIG. 3a comprises a ridge 305 positioned between two channels 312. The waveguide it tilted at an angle θ with respect to the normal at the facet 322. In a state of the art tilted waveguide, whether it is straight or curved, the waveguide extends to the facet of the chip, as shown in FIG. 3a for an exemplary ridge waveguide.

It is recalled that light propagation is guided by total internal reflection at the lateral boundaries of the guide where there is a refractive index step. In the exemplary case where the center of the guide is a narrow ridge bounded by two channels of slightly lower refractive index, the ridge width "w" and the refractive index step Δn are chosen such that light propagation is in the lowest waveguide mode. This mode is such that its profile inside the ridge is single a cosine function having a single peak at the center and is an exponentially decaying function in the channels outside the ridge. For single-mode operation, the required ridge width is related to the index step by the relation—

$$w = \frac{\lambda}{2\sqrt{2n_e \Delta n}} \quad (5)$$

where λ is the wavelength and $n_e$ is the effective refractive index in the ridge.

As an example, for a device designed for infrared wavelength at 830 nm, the ridge width would be 2 to 3 μm and the channel depth is may be selected such that Δn is between 0.003 and 0.01 for single-mode guiding operation. As a result of the small refractive index step between the ridge and the channels, when the incidence angle at the walls exceeds the critical angle total internal reflection occurs at the waveguide sidewalls. Light propagates along ridge axis by bouncing back and forth in a zigzag manner due to total internal reflection. For $n_e$=3.34, and Δn=0.006, the zigzag angle is about 3.4 degrees. Therefore the reflected rays at and below the zigzag angle at the walls will be captured in the waveguide and all other rays will escape into the bulk of the structure.

If the waveguide were to be perpendicular to the facet, all reflected rays would be captured in the waveguide. As noted earlier, most of the reflected light propagates at twice the tilt angle with respect to the waveguide. However, due to diffraction, light has a certain angular spread at the facet shown collectively as 314 in FIG. 3a. Due to the tilt angle, only a small fraction of the reflected light shown as 316 falls within the acceptance angle of the waveguide. This fraction of reflected light propagates in the waveguide in the backward direction by total internal reflection in a path shown as 331 in the waveguide. The fraction of light traversing backward determines the facet reflectivity of the tilted waveguide.

Although reflectivity falls off with increasing tilt angle, it is not practical to arbitrarily increase the angle. According to Snell's law, the output angle of the emitted light from the facet is significantly larger than the angle inside the structure because of the large refractive index difference between the outside air space and the semiconductor medium, and a large angle makes output coupling to an optical fiber difficult or impossible. Typically, the output light is coupled to an optical fiber, and it is very difficult to fiber-couple the output light at an angle greater than about 25 degrees. Therefore, in a typical design the tilt angle of the waveguide is limited to about 6-degree for which an effective reflectivity of less than $10^{-4}$ may be achieved.

For reflectivity value lower than $10^{-4}$, tilting alone is not adequate and further reduction in reflectivity value to about $10^{-5}$ to $10^{-6}$ may be achieved by applying antireflection (AR) coating on the facet. The ideal AR coating is a quarter-wave (thickness) layer of a dielectric material whose refractive index is close to the square root (about 1.83) of the semiconductor refractive index. Typical AR materials are $SiO_2$ (refractive index about 1.47) or $Al_2O_3$ (refractive index about 1.67).

Truncated Waveguide Design:

One important aspect of this invention is to provide facet reflectivity that is several orders of magnitude below the reflectivity level already achieved by the tilt angle and AR coatings described in prior art devices disclosed in the U.S. Pat. Nos. 8,269,977 and 8,259,304 issued on Sep. 18, 2012, and Sep. 4, 2012, respectively, both to Alphonse. The basic concept to reduce the reflectivity of the angled facet further may be understood in view of an embodiment comprising a truncated waveguide structure shown in FIG. 4. Referring back to the prior art device shown in FIGS. 1, 2 and 3, it is noted that the waveguide structure which is the light generating/amplifying element, is extended between the two extremities of the device and terminates at respective end facets. Therefore light may possibly be guided in the waveguide region from end-to-end in both directions. In the new design to be described shortly, both ends of the waveguide structure need not always terminate at a respective end facet. Instead, the light generating/amplifying element includes two regions; one where light is guided for example, in a waveguide structure, and a second region where light traverses unguided. A direct consequence of this new design concept is to substantially reduce the light that would potentially be trapped in the waveguide as shown in FIG. 3.

More specifically, FIG. 4a shows a surface view of a waveguide comprising a ridge 405 (under the contact metal strip 430 shaded dark grey) that is disposed between two channels 412. This aspect is more clearly shown in FIG. 4b representing a cross section view of the layered structure projected across a line AA' (FIG. 4a). In this region, the layered structure is substantially similar to those shown in FIGS. 1b and 3b and will not be described in detail for brevity. The waveguide is positioned at an angle θ with respect to the normal at the front facet end 422. In addition, the waveguide is terminated or truncated at some distance 'h' away before reaching an end facet, for example, the front end facet. It should be noted that the truncated waveguide design is most effective when the truncated end of the waveguide is disposed at an angle with respected to the normal of the end facet.

In a truncated waveguide shown in FIG. 4a, while the ridge is disposed at a small angle θ with respect to the normal at the end facet, it does not extend all the way to the front facet. The truncation of the waveguide is effected by terminating the ridge 405 and channels 412 providing lateral confinement, at a short distance before reaching the front facet 422. Essentially, in a section 420 of the device there is no lateral confinement region. Instead, only the contact metal strip 430 above the ridge extends all the way to the facet end 422 thereby providing an electric contact to the essentially flat semiconductor region immediately under the metal strip in that region. Therefore, light would traverse unguided in this region of the semiconductor material.

This aspect is more clearly shown in the cross section view shown in FIG. 4c projected in a section of the unguided region near the end facet. A quick comparison of FIGS. 4b and 4c reveals that while the ridge and the channels (405 and 412, respectively) are present in the waveguide region, these features are absent in a distance 'h' between the truncated waveguide and the facet 422. The electrical contact 407 extends over an essentially flat semiconductor region located under the stripe 430 extending all the way to the facet 422. An electric current shown collectively by arrows 409 passes in the semiconductor region under the stripe 430 (in a vertical plane in this figure between the two end terminals 407 and 408, not shown in this view) to pump this region electrically to prevent optical absorption losses and allow light propagation to the facet without significant attenuation. The light emitted from the guided region propagates freely in the unguided region and emerges as an elliptic spot 411.

Truncating the waveguide at a short distance from the facet (to be synonymously referred as truncation distance hereinafter) allows the light to propagate freely (in a straight line without guiding boundaries) to the facet where it is partially reflected. The reflected wave propagates away from the facet and away from the waveguide at twice the tilt angle in the unguided free-propagating portion of the structure which is essentially flat. The fraction of light captured by the waveguide becomes a function of the facet angle and the truncation distance 'h'. This distance is carefully selected such that virtually no reflected ray can reach the waveguide.

As mentioned earlier, diffraction causes the reflected light to spread out in a cone, as indicated by arrows collectively labeled as 414 near the facet in FIG. 4a. A small component of reflected light comprising facet reflection shown by a thick white arrow 416, within the stripe region 430 near the facet would be intercepted by the waveguide if the guided region were to extend to the front facet. Using Eq. (5), it can be shown that the angle to which reflected light may spread is approximately equal to $\lambda/w$. It can also be shown that for an exemplary tilt angle $\theta > 3$ degrees, the preferred offset distance is described by the relation—

$$h > \frac{3\lambda}{2\sqrt{2n_e \Delta n} \tan\theta} \quad (6)$$

Thus, knowing the diffraction spread of the reflected wave at the facet, the required offset distance 'h' for the truncation may accordingly be determined to ascertain that the effective reflectivity at the facet is reduced to a pre-determined value substantially lower than possible by the maximum allowable tilt angle and application of an AR coating. Therefore the truncation distance in a tilted waveguide structure provides an additional design tool to achieve a facet reflectivity value substantially lower than would be achieved by the tilt angle and/or AR coating alone. By carefully adjusting the distance 'h' of the unguided region, the component 416 of the reflected is thus prevented from reaching the waveguide. It is noted that while the light reflected from the facet may not couple to the waveguide, a light from an external source may still be coupled to the waveguide when a collimated light is launched at the facet at an appropriate angle such that it can be captured in the waveguide beyond the truncation distance.

Returning to the cross section view shown in FIG. 4c, the contact metal stripe 430 extending to the facet has about the same width as the ridge and it correctly describes the operation of the device when lateral absorption loss in the region is negligible because there is no index step. However, depending on material characteristics at a particular operation wavelength, there may be some lateral absorption at the contact stripe interface, as will be discussed next. It may be recalled from earlier discussion that the gain is exponential with the current and the waveguide length. In the absence of electric current, the material exhibits some absorption. Optical gain is achieved when stimulated emission under the application of electric current exceeds the absorption loss. The gain is given by $G = \exp[gI - \alpha L]$, where g is the gain coefficient, I is the electric current, $\alpha$ is the absorption coefficient, and L is the length of the active waveguide. Net gain is achieved when gI is larger than $\alpha L$.

Figure 4:
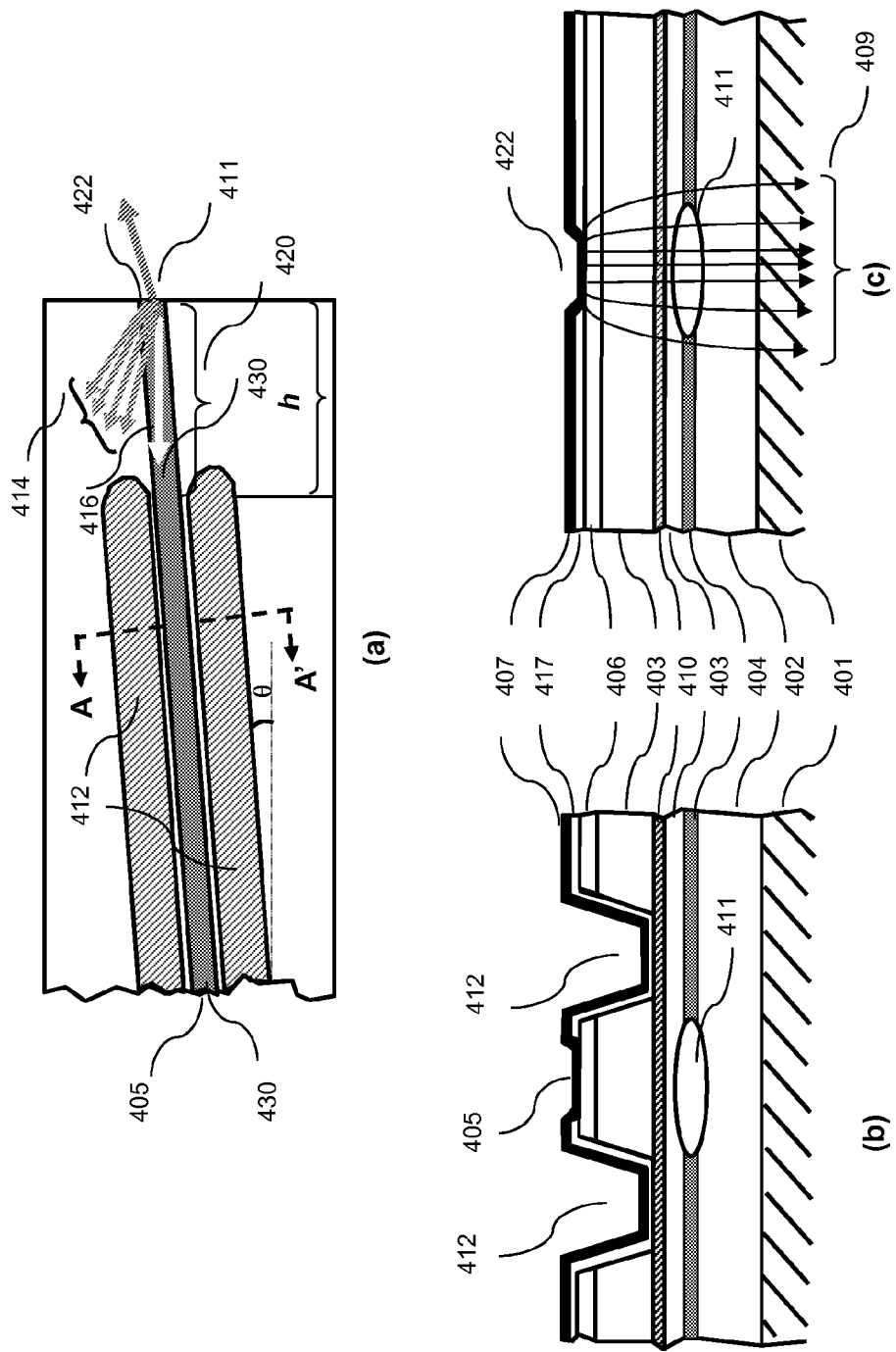
FIG. 4 is a schematic representation of a truncated waveguide structure constructed according to this invention: a) a top view, b) a cross section view of the truncated waveguide section, and c) cross section view of a region showing unguided section near an end facet of the device.

In general, the applied current shown collectively as 409 is not confined strictly to the region under the metalized stripe. It spreads slightly on the sides of the stripe as it flows from the p-side to the n-side, and that spread may be sufficient to overcome lateral absorption and prevent the presence of any (real, complex, or imaginary) refractive index step in the immediate vicinity of the current stripe. In this case, the embodiment shown in FIG. 4 is adequate for the operation of the device. However, if the device is operated at a wavelength where absorption is not low, a wave guiding effect may still exist in the facet area by a process called "gain guiding" due to the imaginary part of the complex refractive index in the presence of absorption.

As an example, for GaAs (gallium arsenide), one of many commonly used materials for semiconductor light sources including lasers, SLD, SOA, etc. in the near infrared region, the absorption coefficient is negligibly small at wavelengths longer than about 900 nm, but it is quite high at wavelengths of about 800 nm and shorter. It is known that the refractive index is a real number in wavelength region where there is no absorption, but it is a complex quantity where there is absorption. In particular, the refractive index of GaAs is about 3.4 above 900 nm, but its value is 3.4−i0.179 around 800 nm, and 'i' is the square root of −1. Therefore $\Delta n = 0$ above 900 nm but it is $\Delta n = -i0.179$ at 800 nm.

The existence of an index step at 800 nm (albeit imaginary) would cause reflection to exist at the metalized to non-metalized interface at the facet which would guide some light back into the ridge. In fact, in the early days of semiconductor laser development, guides were made entirely from a conducting stripe and the devices were called "gain guided". The lateral index step in ridge structures is real, and devices made from ridges are called "index guided". Gain guiding is typically weaker than index guiding, and it is likely to trap a lesser amount of facet reflection, as exemplified in U.S. Pat. No. 4,958,355, issued to Gerard A. Alphonse et al. on Sep. 18, 1990. However, gain guiding is not desirable because it introduces wavefront distortion which reduces fiber coupling efficiency.

Figure 5:
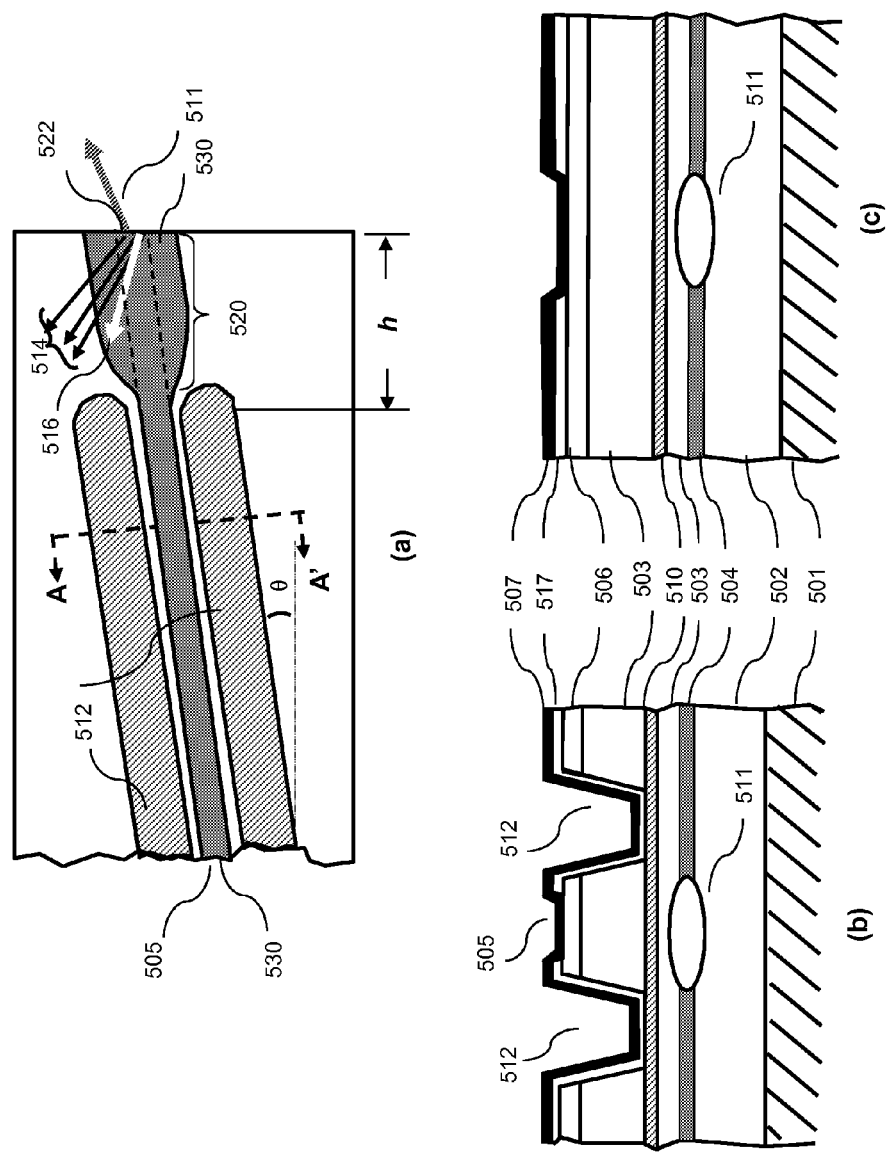
FIG. 5 is a schematic representation of a truncated waveguide including a flared metal contact region; a) top view showing the flared metallization, b) cross-section of the truncated waveguide section, and c) cross-section of a region showing the unguided section near an end facet of the device.

Effect of gain guiding may be prevented in another preferred embodiment shown in FIG. 5. The embodiment shown in FIG. 5 also includes a truncated waveguide described earlier in reference to the device described in FIG. 4. That description is recalled here to avoid repetition. Only the differences between the two devices shown in FIGS. 5 and 4 will be highlighted in the following discussion. More specifically, FIG. 5a is a top view of the device including a ridge 505 disposed between two channels 512. The ridge in this view is under a metal contact strip 530 and is more clearly visible in a cross section view shown in FIG. 5b, projected along a line AA' through the waveguide region.

The cross section view shown in FIG. 5b is substantially similar to the one described in reference with FIGS. 1b, 3b and 4b and that description will not be repeated. As described earlier in reference with FIG. 4a, there is no refractive index step between the truncated waveguide and the front facet and is more clearly shown in the cross section view shown in FIG. 5c. More specifically, the waveguide region including the ridge and channels are absent under the metal contact region 530 near the facet 522. As a result, light including the reflected components shown collectively as 514 and the facet reflection component 516 (thick white arrow), to travel freely in the unguided region. The output light exiting the waveguide at the facet is still in the shape of an elliptic spot 511.

The main difference between the devices shown in reference with FIGS. 4 and 5 is in the region 520 between the waveguide truncation and the front facet 522 shown in FIG. 5a. In the embodiment shown in FIG. 5, the width of the metal contact region 530 is flared or widened between the truncated end of the waveguide and the front facet as shown in FIG. 5a. Furthermore, the metal contact strip in the unguided region is widened preferably symmetrically, on each side, of the optical path (shown as dashed line extending to the front facet) by an amount approximately equal to the width of the optical path. Flaring or widening the metal contact region over an area slightly wider than the optical path extends the $\Delta n=0$ region beyond the optical path boundary. The width of the flared area should be such that the facet reflection component 516 is not deflected toward the ridge, thereby preventing it to reach the ridge. It is sufficient to make the width of the flare about twice the ridge width, typically about 4 to 6 μm for a 2-3 μm wide ridge.

Effect of the Truncation Distance h:

It may be recalled from earlier discussion in reference with FIG. 3a, that for a tilted waveguide extended all the way to the front facet, the facet reflectivity may be reduced by increasing the tilt angle. It is also known that the angle at which the light would exit the waveguide facet increases as the tilt angle increases. For example, if the waveguide is tilted by 3° and 6°, the output angle at which the light would exit the waveguide facet would be about 10° and 20°, respectively. While light exiting the waveguide at these output angles may be effectively or adequately coupled to a fiber, the facet reflectivity is not sufficiently low to suppress ripples in the output light as discussed earlier in reference to FIG. 2.

Therefore an optical source constructed from a tilted waveguide (shown in FIG. 3a) having a 3° tilt, will not have a smooth spectral profile. An optical source comprising a 6° tilt waveguide would be better because of a lower facet reflectivity and in particular, would lower the facet reflectivity by about 8-10 dB when used in combination with an AR coating to. Increasing the tilt angle further for example to 7° or 8° would lower facet reflectivity significantly, but would result in light exiting the waveguide at an output angle that is too large to efficiently couple the light to a fiber. Therefore there exists a practical limit to increasing the tilt angle, as would be intuitively inferred from the upper trace shown in FIG. 6.

Figure 6:
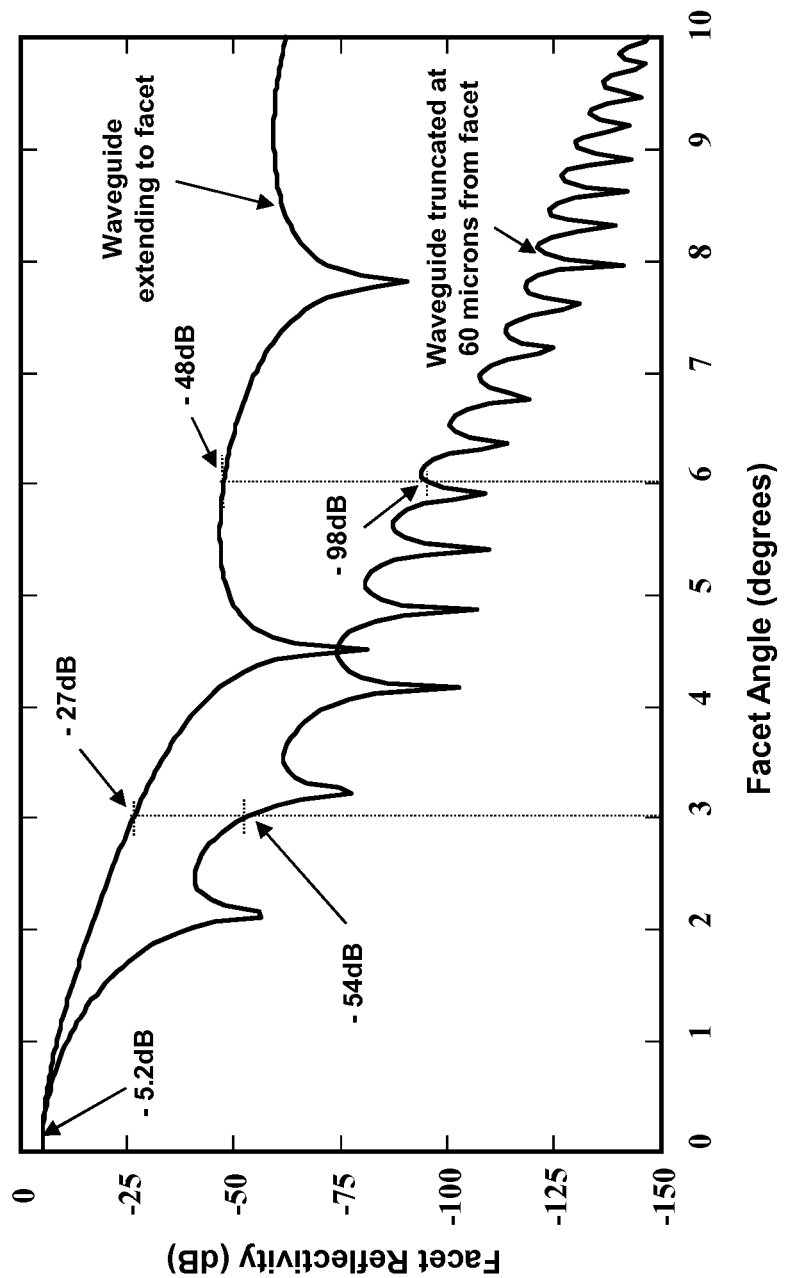
FIG. 6 shows facet reflectivity profiles of a tilted waveguide structure; a) extended to the end facet, and b) truncated at a distance away from the facet.

However, an optical source constructed from a tilted waveguide that is truncated at some distance away from the front facet as shown in FIGS. 4a and 5a, is more efficient. The effectiveness of having a truncated waveguide with an unguided region near the facet in reducing facet reflectivity of a tilted waveguide may be appreciated better by calculated reflectivity plots shown in FIGS. 6, 7 and 8. More specifically, FIG. 6 shows effective facet reflectivity values without applying any antireflection coating, plotted on y-axis as a function of tilt angle (x-axis). For convenience, the dB scale is used on y-axis, where $R_{dB}=10 \, Log_{10}R$. The upper trace represent reflectivity (synonymously used instead of facet reflectivity for simplicity) for a waveguide that extends all the way to the front facet (for example as shown in FIG. 3a), whereas the lower trace represents facet reflectivity of a truncated waveguide (for example, as shown in FIG. 4a or 5a) where the waveguide is terminated at a truncation distance of about 60 μm from the front facet.

In general, the reflectivity decreases with increasing angle in both the traces and exhibit broad sloping regions separated by relatively sharp dips caused by the phase variations in beam profile across the end facet. It should be noted that although very sharp dips in reflectivity is exhibited at certain tilt angles, a design for those tilt angles would not be robust against material variations and fabrication parameters because those dips are not sufficiently broad. A more reliable design would be one where tilt angles correspond to one of the broad regions.

To fully appreciate the impact of truncation it is useful to look at some reference points indicated by arrows in the plots shown in FIG. 6. More specifically, it is noted that in the upper trace corresponding to a waveguide design where the waveguide is not truncated, reflectivity values are −5.2 dB (or 30%), −27 dB (or $2\times10^{-3}$), and −48 dB (or $1.6\times10^{-5}$) for 0°, 3° and 6° tilt angles, respectively. For a waveguide design with a truncation distance of about 60 μm shown in the lower trace, the corresponding reflectivity values are −54 dB (or $4\times10^{-6}$) and −98 dB (or $1.6\times10^{-10}$) for 3° and 6° tilt angles, respectively, are lower by about $10^{-3}$-$10^{-5}$ in this range of tilt angles. It should be further noted that for a truncated waveguide, not only the reflectivity is lower but the overall slope is negative such that the reflectivity gets progressively lower as the tilt angle increases. A longer truncation distance would further reduce the reflectivity further as will be discussed shortly.

Figure 7:
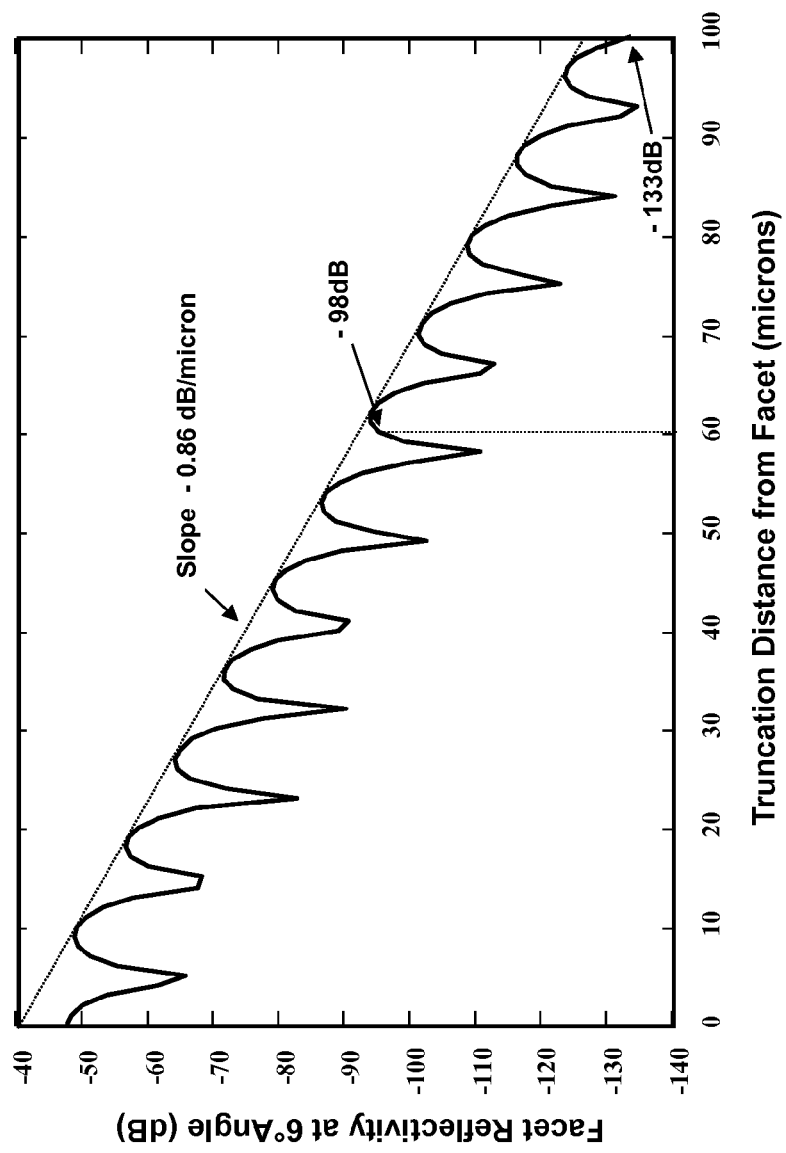
FIG. 7 shows facet reflectivity at 6-degree angle as a function of truncation distance (in μm) from the end facet.
Figure 8:
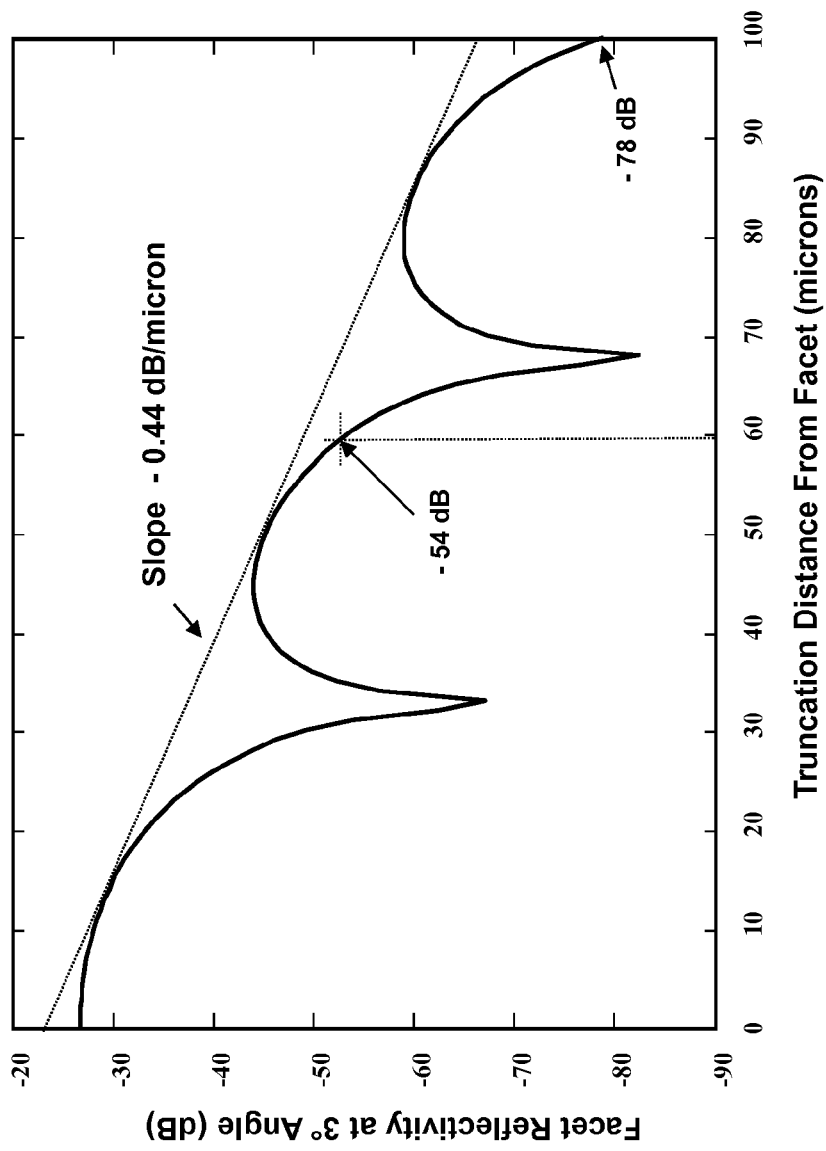
FIG. 8 shows facet reflectivity at 3-degree angle as a function of truncation distance (in μm) from the end facet.

Effect of truncation is further illustrated from a plot where reflectivity is calculated as a function of truncation distance for a fixed tilt angle of the waveguide. The results are shown in FIGS. 7 and 8 for waveguide tilt angles 6° and 3°, respectively. More specifically, the trace in FIG. 7 shows reflectivity (in dB on y-axis) as a function of truncation distance (in μm on x-axis) for a 6° angle tilted and truncated waveguide similar to ones shown in FIGS. 4a and 5a. In particular, a few specific facet reflectivity values for a truncated waveguide are about −98 dB (or $1.6\times10^{-10}$), −123 dB (or $5\times10^{-13}$) and −133 dB ($5\times10^{-15}$) at truncation distances of 60 μm, about 98 μm and 100 μm, respectively, that are marked with arrows on the trace. It is noted that the reflectivity values continue to drop as the truncation distance increases exhibiting a −0.86 dB/μm slope (shown by the dotted line). For a comparison with a counterpart waveguide without truncation, reflectivity is about −48 dB (or $1.6\times10^{-5}$) at 6° tilt angle (FIG. 6).

Reflectivity data as a function of truncation distance for a truncated waveguide tilted at 3° is shown in FIG. 8. More specifically, the trace shows reflectivity (in dB on y-axis) as a function of offset distance (in μm on x-axis) and the arrows indicate reflectivity values at specific truncation distance. In particular, reflectivity values are about −54 dB (or $4\times10^{-6}$) and −78 dB ($1.6\times10^{-8}$) for truncation distances of 60 μm and 100 μm, respectively with a −0.44 dB/μm slope (shown by the dotted line). For a comparison with a counterpart waveguide without truncation, reflectivity is about −27 dB (or 2×10⁻³) at 3° tilt angle (FIG. 6).

From the above discussion in reference to FIGS. 6, 7 and 8, it can be appreciated that, a device constructed from a tilted waveguide shown in FIG. 3a with a 3° tilt angle at the facet would not be as useful for a source with a smooth spectral profile. However, a source designed with a tilted truncated waveguide (shown in FIGS. 4a and 5a) with the same 3° tilt angle would be a better source for a truncation distance that is about 60 to 100 μm. Advantageously, a small tilt angle also lowers the output angle and would be additionally beneficial for efficiently coupling the output light to a fiber.

New Broadband Semiconductor Optical Sources:

From the description provided in the previous sections, it is understood that the truncated waveguide concept outlined therein is a very effective design tool to reduce facet reflectivity to about $10^{-10}$ or lower, even without applying an AR coating. In particular, the facet reflectivity may be reduced quite drastically by selecting an appropriate combination of tilt angle and truncation distance. The concept may be applied to construct a class of new optical sources and/or optical gain medium for tunable optical device, that are particularly efficient in suppressing spectral modulation or spurious spectral lines arising due facet reflectivity. Advantageously, the design concepts described in this application are effective even when devices are operated at high optical gain conditions and high output power. This class of new sources comprises waveguide structures that are different from traditional waveguides, often used in prior art semiconductor sources. Furthermore, applying different types of antireflective coatings may further extend the bandwidth, and is particularly suitable for constructing extended bandwidth broadband sources. In the following sections different devices where the invention may be practiced will be described. Many of these new devices for generating and amplifying light outperform their prior art counterparts, and in particular, in output power level and spectral modulation characteristics.

Double-Pass Optical Sources:

Principles of the invention described earlier will be applied in constructing a double-pass optical source for example, a semiconductor double-pass source such as SLD, a SOA, or using a dielectric waveguide structure such as optical fiber. As mentioned earlier in the "Related Art" section, SLD has been disclosed in many United States patents and non-patent literature publications. Most devices did not operate to their full potential in terms of available gain, output power and level of residual spectral modulation that ultimately limit their performance at high output power. Many of these limitations may be overcome in an exemplary embodiment shown schematically in FIG. 9 incorporating the new waveguide design outlined in reference to FIGS. 3, 4, 5, 6, 7 and 8.

While a device having a curved waveguide will be described for illustrative purpose, the description is equally pertinent for a tilted waveguide. In a preferred embodiment, an exemplary SLD is configured using a curved waveguide 905 located under the contact metal strip 930 and is not visible clearly in this planar view. The waveguide in form of a ridge is disposed by creating two channels 912 by selectively etching the surrounding cladding layer. One end of the waveguide is disposed perpendicular to the back facet 921, and the other end is tilted at an angle θ at the front facet 922. Curved waveguide has been used as a gain medium in external cavity tunable laser as described in the U.S. Pat. No. 6,091,755 issued to Sanders et al on Jul. 18, 2000, and commercially available from Thorlabs® Quantum Electronics. However, in the devices disclosed therein, reflectivity at the perpendicular facet is about 10% and reflectivity at the tilted facet is about $10^{-4}$ which is adequate for laser application but will result in significantly high spectral modulation that cannot be tolerated for a broadband source such as SLD or SOA. A spectral modulation of about 2% or lower, is generally considered negligible.

To achieve lower spectral modulation in a broadband source, very low facet reflectivity is desired. In the embodiment shown in FIG. 9, the waveguide is truncated at a distance 'h' from the front facet 922. Truncation distance 'h' may be selected to achieve an extremely low facet reflectivity. The front end of the device is substantially similar to the one described in FIG. 5a where the contact strip 930 is flared near the front facet 922. However, a non-flared contact shown in FIG. 4a can also be used.

The front facet may optionally be coated with suitable AR coating 932 to achieve a desired pre-determined low reflectivity. However, the back facet is coated with a reflective coating 931 to provide enough reflectivity to achieve a high output power as per Eq. 4. The output light 911 exits from the front end facet 922 at an angle as shown by the bold arrow. In an exemplary device comprising a waveguide tilted at about 6° and truncated at a distance of about 60 mm from the front facet, a facet reflectivity of the order of $10^{-10}$ may be achieved even without an AR coating. Corresponding spectral modulation would be less than 0.4%, substantially lower than what is currently considered to be negligible (<2%) in the industry. Therefore truncated waveguide design outlined in this invention practically eliminates the front facet reflectivity to achieve an SLD with very high output power and negligible spectral modulation for a reasonable gain.

Figure 9:
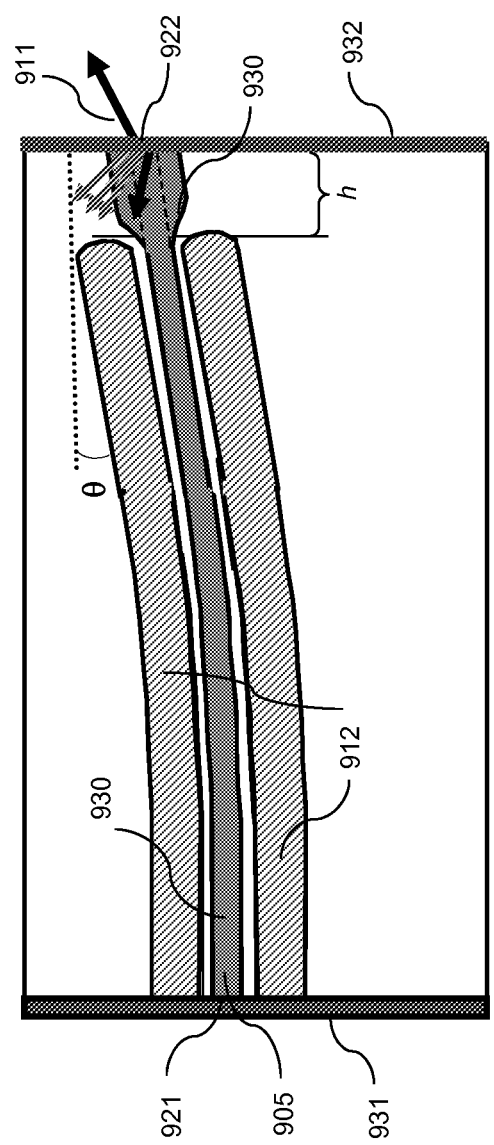
FIG. 9 shows an exemplary waveguide structure of a double-pass source featuring a truncated curved waveguide incorporating an unguided region.

The truncated waveguide shown in FIG. 9 may be configured as a high power double pass SLD source or may just be used as an efficient gain medium in an external cavity optical source, including external cavity broadband source, external cavity laser, etc. Referring back to Eq. (4), it may be recalled that the output power in a double-pass SLD, Eq. (4) includes two terms—a first term $P_{SP}G$, which corresponds to the first pass (like an ordinary SLD), and a second term $(R_1G+1)$ which corresponds a reflected component propagating backward in the waveguide, which would be lost in the single-pass SLD. According to Eq. (4), this reflected term effectively makes the output proportional to the square of the gain, even when the single pass gain in the waveguide is moderate (for example when operated at a low current).

The inclusion of the second term in Eq. (4) makes the double-pass SLD more efficient than the single-pass SLD by a multiplicative factor $R_1G$. Therefore output power in a double-pass SLD proportional to the square of single pass gain G. For a quick comparison, for 15 mW output power at each facet, a single-pass SLD would require a gain of 5000 whereas a double-pass SLD of comparable physical dimension made from the same chip and with a mere 10% back facet reflection $(R_1)$, would require a gain of only 70, and only a gain of 580 for 100 mW output power. Notably, for the same output power, an SLD device configured using a truncated waveguide according to the principles of this invention may be operated at a lower current as compared to a SLD of comparable dimension configured using a tilted waveguide (whether truncated or not). It is known that devices operated at lower current require less peripheral cooling systems and have a longer operating life.

One important factor to remember is radiation loss in a curved waveguide. In the curved waveguide double-pass SLD device, it is important to ensure that radiation losses due to the waveguide curvature be kept to a minimum. Calculations reveal that the radius of curvature 'r' required for less than 1% radiation loss must satisfy the relation—

$$r > \frac{3}{2\pi\sqrt{2}} \frac{\sqrt{n_f}}{(\Delta n)^{3/2}} \lambda \qquad (7)$$

where, $n_f$ is the bulk refractive index of the waveguide, is the wavelength, and $\Delta n$ is the refractive index step between the ridge and the lateral (channel) regions. At a wavelength of 1 μm and for $n_f$=3.4 and $\Delta n$=0.005, the minimum radius is of the order of 1.8 mm. This condition is easily satisfied, since in most instances the radius of curvature for a waveguide 1-mm in length is would be of the order of 10 mm.

The concept of an angled truncated waveguide is also applicable in constructing a double pass optical source in an optical fiber which is basically a dielectric waveguide structure. It is common knowledge that a piece of a fiber doped with a rare earth ion in the core region is used as a gain medium for example in an Erbium Doped Fiber Amplifier (EDFA). To apply the concepts of this invention outlined in reference with a semiconductor gain medium, one end of a fiber is cleaved straight to construct a facet perpendicular to the linear axis of the fiber (axis along the length of the fiber) and polished by any standard polishing method such as flame polishing, to make the cleaved straight end reflective. The reflectivity may further be adjusted by applying an optical coating to the facet. Different methods to achieve a desired reflectivity are well known in the art of optical fiber.

The other opposite end is cleaved at a desired angle to implement an angled waveguide. The angled end is made less reflective as compared to the flat cleaved end. In order to truncate the waveguide, the angled end of the fiber is selectively heated to a controlled temperature such that the core and the cladding regions partially diffuse, and the refractive index difference between the core and cladding is practically eliminated. As a result, the core does not support guided transmission of light within a certain distance from the angled end. The truncation distance and the angle at which fiber is cleaved are selected such that a desired low reflectivity value is achieved. The length of the fiber may be selected for a desired level of gain for a double-pass optical source. This type of truncated waveguide fiber may be used as a gain medium in an external cavity device. Advantageously, a fiber gain medium has a very wide spectral response.

Bandwidth Enhancement in a Double-Pass SLD:

It is recalled that a Light Emitting Diode (LED) has no or negligible optical gain and its output power and optical bandwidth is governed only by spontaneous emission characteristics of the material comprising the LED. The material making up an LED is an indirect bandgap material. It cannot support meaningful stimulated emission, or if it is made from a direct bandgap material, its length is very short. Consequently, there is very little gain in the system and light output is at a low power (of the order of 1 mW or less). The spontaneous emission bandwidth is of the order of 90 to 100 nm for a device operating at a center wavelength of about 840 nm. If the material is capable of supporting optical gain, then as the drive current is increased the gain increases, but because of the exponential dependence of the gain coefficient, the bandwidth B reduces with increasing gain, being given approximately by—

$$B \approx \frac{B_{SP}}{\sqrt{\ln(G) + \alpha L}} \qquad (8)$$

where $B_{SP}$ is the spontaneous emission bandwidth, ln(G) is natural log of the single-pass gain G, α the absorption coefficient, and L is the length of the device.

Therefore, if the spontaneous emission bandwidth is 90 nm, the bandwidth of an SLD at a gain of 5000 and negligible absorption is of the order of 30 nm. Since the double-pass SLD operates at a much lower gain than an SLD, it has a broader single-pass bandwidth, but since the output power is proportional to the square of the gain, the bandwidth is reduced by the square root of 2. The result is that the double-pass SLD bandwidth is about the same bandwidth as that of a single-pass SLD having the same output power.

Referring back to Eq. (4), there it teaches that the double-pass output power is also proportional to the product $R_1 G^2$, where $R_1$ is the back facet reflectivity. Thus, being proportional to the back reflectivity, the bandwidth of the double-pass device can be significantly enhanced by careful design of the back facet reflectivity. Methods for designing reflective surfaces to tailor facet reflectivity and in particular back facet reflectivity are disclosed in the U.S. Pat. No. 8,269,977 issued on Sep. 18, 2012 to Alphonse. The content of that patent is being incorporated by reference in its entirety. There it teaches methods to design the reflectivity profile of $R_1$ such that it is higher at the band edges of the gain spectrum than at the center by invoking the concept that $R_1$ and G, are wavelength dependent quantities and exhibit a spectral profile.

To incorporate this concept into the design of a double-pass SLD, a modified form of Eq. (4) using wavelength dependent $R_1$ and G may be written as—

$$P_{out} \approx P_{SP} R_1(\lambda) G^2(\lambda) \qquad (9)$$

where $G(\lambda) = G_o S(\lambda)$ and $S(\lambda)$, represented approximately as a Gaussian spectrum, is given by—

$$S(\lambda) = \frac{p}{\sqrt{\pi}} \exp\left[-p^2(\lambda - \lambda_c)^2\right], \qquad (10)$$

and $$p = \frac{2\sqrt{\ln 2}}{\Delta\lambda}$$

In the above expressions, λ is the wavelength, $\lambda_c$ is the center frequency, p is the standard deviation of the Gaussian spectrum and Δλ is the 3-dB Gaussian bandwidth. Eq. (10) shows that, if the reflectivity profile or $R_1$ increases toward the band edges of the gain medium (a raised-edge profile), it effectively offsets the fall-off of the gain at the band edges and effectively increases the bandwidth. In particular, if the back reflectivity is higher by a factor of 4 at the semiconductor 3-dB points than at the center, then the overall bandwidth is flat at least up to that point. Construction of a raised-edge profile reflector is disclosed in the U.S. Pat. No. 8,269,977 issued on Sep. 18, 2012 to Alphonse. Content of this patent is incorporated by reference in its entirety.

More specifically, Alphonse discloses that a reflector having a raised-edge-profile reflectivity is readily achieved by when the reflector is designed as an etalon whose minimum reflectivity is at the center wavelength of the device and a Free Spectral Range (FSR) is slightly wider than the bandwidth of interest to be controlled. In the above mentioned patent to Alphonse, different design examples are disclosed where reflector is deposited on a substrate external to the gain medium, as well as examples where reflector is deposited directly on the gain medium's facet. That description is being incorporated herein in its entirety.

Figure 10:
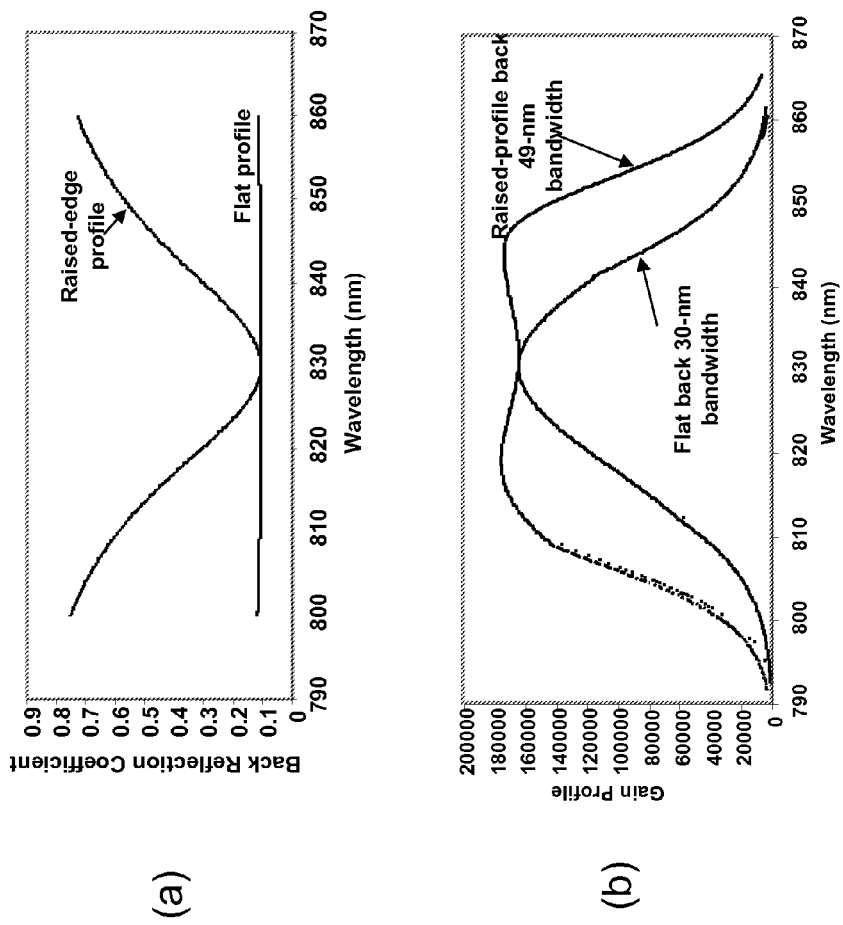
FIG. 10 shows spectral profile comparison of a, a) raised-edge reflectivity profile and a flat reflectivity profile, and b) gain profile of a double-pass source having a raised-edge back reflector with the gain profile of a source having a flat-profile.

FIG. 10(a) shows a prior art raised-edge back reflectivity profile in which the reflectivity at mid-band is about 10% at 830 nm and about 75% at 800 nm and 860 nm (raised-edge profile contrast of 7.5), as compared to a standard flat reflectivity over the same range. FIG. 10(b) illustrates bandwidth enhancement as a result of applying a raised-edge etalon reflector. The inner trace represents the spectrum with a flat profile back reflector and shows a half-power bandwidth of 30 nm. The outer trace is the spectrum with the raised edge back reflector. It shows a bandwidth of 49 nm, an increase of 63% over the case with the flat back reflector.

Figure 11:
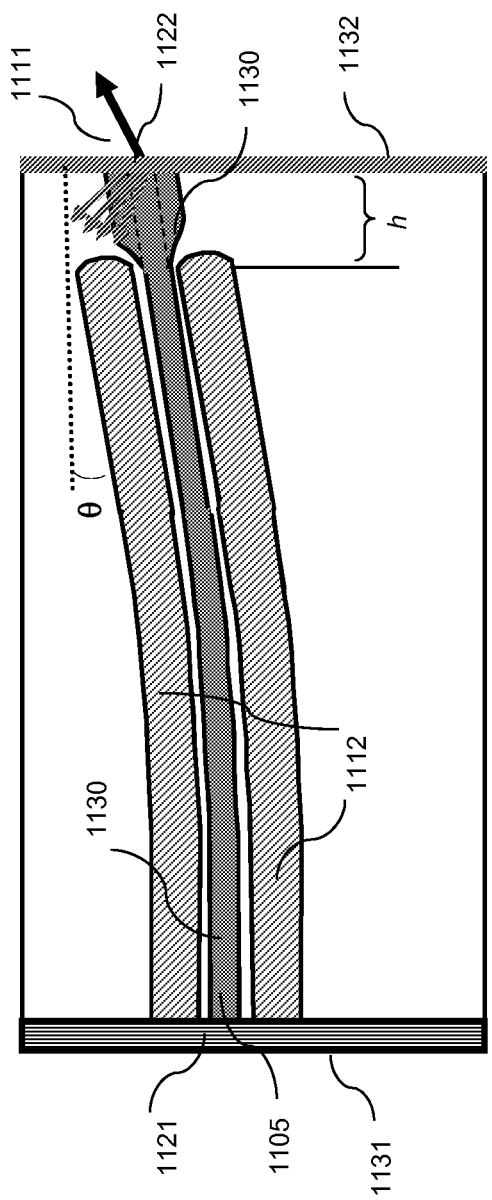
FIG. 11 shows a preferred configuration of a double-pass light source featuring a truncated curved waveguide incorporating the unguided region and a back facet including a raised-edge reflectivity profile.

FIG. 11 shows an exemplary embodiment of the broad bandwidth double-pass SLD incorporating a $Si/SiO_2$ raised-edge profile back reflector. A curved waveguide structure truncated at a distance 'h' from the front facet, substantially similar to the one described in reference with FIG. 9 is used to configure this embodiment. Elements having similar functionality are labeled with same reference numerals in FIGS. 9 and 11 and the description provided in reference to FIG. 9 is equally pertinent to FIG. 11. That description will not be repeated for brevity. In this particular embodiment, the waveguide is perpendicular to the back facet and tilted at the front facet at a 6° tilt angle, and the truncation distance is about 60 microns.

The front facet coating 1132 is a single quarterwave layer of $SiO_2$ and the effective front facet reflectivity is of the order of $10^{-5}$. The device shown in FIG. 11 differs from the device shown in FIG. 9 in the optical coating 1131 applied on the back facet 1121. In the embodiment shown in FIG. 11 the optical coating deposited directly on the back facet of a curved ridge waveguide semiconductor gain medium is a reflective coating having a raised-edge reflectivity using any desirable combination of etalon materials and thicknesses described in the U.S. Pat. No. 8,269,977 issued on Sep. 18, 2012 to Alphonse. One preferred design for this reflector to give results similar to those shown in FIG. 10(b) is as follows: a first layer which is Si directly deposited on a GaAs gain medium (Si refractive index 3.68, thickness 5λ/4 or 282 nm); a second layer which is $SiO_2$ (refractive index 1.47, thickness 5λ/4 or 706 nm); a third layer which is Si (thickness 5λ/2 or 564 nm), and a fourth layer which is $SiO_2$ (5λ/2 or 1,412 nm), for a total thickness of 2,964 nm or 2.964 microns. We note that the thicknesses of the third and fourth layers are odd multiples of half-wavelength. This exemplary back reflector on the gain medium has a midband reflectivity of 9.3% and an edge-to-center contrast ratio of 7.7.

Figure 12:
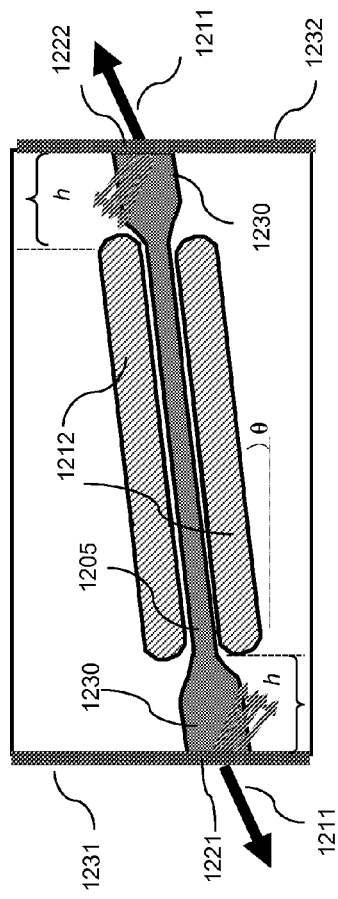
FIG. 12 shows an embodiment of a single-pass SLD including a tilted truncated waveguide structure at both end facets.

Near Ideal Single-Pass SLD:

The principles of this invention in designing a waveguide having very low reflectivity ($\leq 10^{-9}$) facet provides a tool construct optical sources that have near ideal output profile free of spectral modulations or ripples due to unwanted facet reflectivity. One exam invention may be practiced is a single-pass SLD. While a single-pass SLD has been previously described in a non-patent literature publication entitled "Low spectral modulation high-power output from a new AlGaAs super luminescent diode/optical amplifier structure", published by Alphonse et al. in Applied Physics Letters, vol. 55, No. 22, November 1989, pp. 2289-2291, those devices were limited by output power level as well as spectral modulation. An embodiment incorporating principles of this invention in a single-pass optical source is shown in FIG. 12.

More specifically, the SLD is constructed from a tilted waveguide where both ends of the waveguide are disposed at an angle with respect to the facet normal. The waveguide comprises a ridge 1205 (under the contact metal stripe 1230) positioned between two channels 1212. In this configuration, the waveguide is truncated at both ends at a distance 'h' from respective facets 1221 and 1222. Although the truncation distance is shown to be about same on both ends, it need not be so. It may be recalled from the discussion in reference to FIGS. 6, 7 and 8, that the tilt angle and truncation distance may be adjusted to achieve a desired facet reflectivity.

In addition, appropriate AR coatings 1231 and 1232 may be applied to the end facets 1221 and 1222, respectively to further lower the facet reflectivities to a value according to an application where the source will be used. In this particular embodiment, the contact metal stripe 1230 is flared on both ends to reduce light absorption in the unguided region of the device, as has been earlier described in reference to FIG. 5a. That discussion is pertinent in this case as well. In an exemplary single-pass SLD constructed according to this invention having a tilt angle of about 6° and a truncation distance of about 60 μm, facet reflectivity as low as $10^{-9}$ is achieved on both ends of the device. For such low facet reflectivity, estimated spectral modulation is about 0.002% which is extremely low or virtually absent.

Near Ideal DSLS (Discrete Spectrum Light Source) with External Reflector:

In U.S. Pat. Nos. 8,269,977 and 8,259,304 issued on Sep. 18, 2012, and Sep. 4, 2012, respectively, both to Alphonse, it is disclosed that a tilted or curved waveguide may be configured to operate as a high power Discrete Spectrum Source (or a 'Comb' source). In this configuration, the waveguide is used as a gain medium placed between two reflectors essentially to function as a Fabry-Perot device. It may be recalled that one of reflectors preferably the back reflector has reflectivity substantially higher than the front reflector. It is also disclosed that when a comb source is configured using at least one reflector, preferably the back reflector external to the waveguide gain medium, the free spectral range of the device (or the spacing between the discrete spectral lines) may be tuned to match the pitch of a detector array (FIGS. 6 & 7 in the U.S. Pat. No. 8,269,977, and FIG. 9 in the U.S. Pat. No. 8,259,304, respectively).

It is further disclosed that in a DSLS configured with an external reflector, it is desired to have a negligibly small back facet reflectivity (for example by applying AR coating) in order to minimize the possibility of any spurious cavity effect between the two cavities; the one between the front and back facets of the gain medium and one between the front facet of the gain medium and the external back reflector. That description is being incorporated by reference herein for a better appreciation of the following discussion pertaining to the DSLS designed according to this invention.

Figure 13:
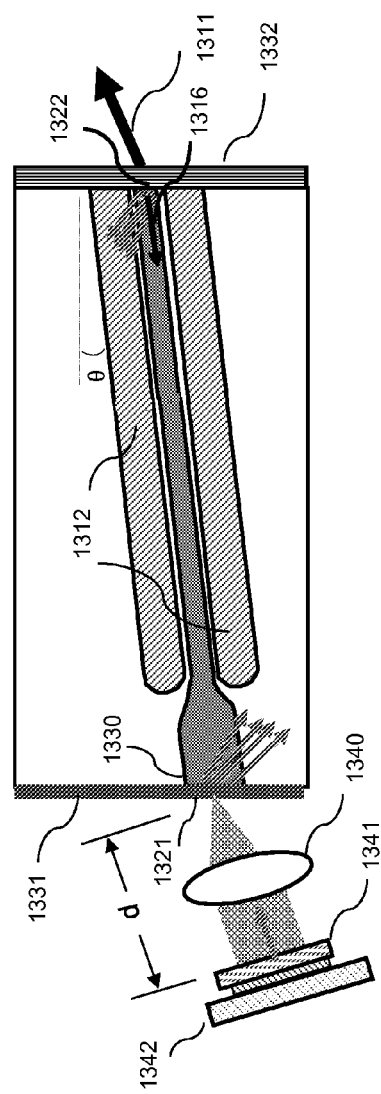
FIG. 13 shows an embodiment of a discrete spectrum broadband light source including a truncated waveguide structure.

As described earlier, a practical limit to achieve reflectivity is about $10^{-6}$ using a traditional tilted waveguide and applying an AR coating. In the embodiment shown in FIG. 13, a new design is described. The embodiment shown in FIG. 13 provides an improved DSLS by incorporating a waveguide that is tilted at the front and back facets. In addition, the waveguide is truncated at a pre-determined distance 'h' from the back facet 1321 only, where facet reflectivity is desired to be significantly lower ($\leq 10^{-9}$ or lower) or practically eliminated. In earlier description in reference with FIGS. 6, 7 and 8, it is shown that facet reflectivity of the order of $10^{-9}$ or lower may be obtained by selecting appropriate tilt angle and truncation distance. In addition, the contact metal stripe 1330 is flared at the back facet to prevent light absorption in the unguided region.

An external reflector 1341 placed on a translation stage is placed beyond the back facet of the waveguide at a distance 'd' that may be varied to adjust the free spectral range of the output light 1311 emitted at the front facet. Light from the back facet 1321 is focused on the external reflector 1341 using peripheral optical components for example, a lens 1340 shown in this configuration. Notably, the output light in this configuration exhibit discrete spectral lines, each line having a high output power as has been described in the prior art patents (U.S. Pat. Nos. 8,259,304 and 8,269,977). It is important to recall that in this configuration, the external reflector 1341 has a higher reflectivity as compared to the front facet 1322.

However, reflectivity at the back facet 1321 is required to be substantially smaller than the front facet reflectivity. Additional AR coating 1332 may be optionally used to achieve a desired reflectivity profile. For example, the reflective coating 1332 may include a raised-edge reflectivity profile for enhancing overall bandwidth of the device as explained earlier in reference to the device shown in FIG. 11. Similarly, the external reflector may also include a raised-edge reflectivity profile. Several methods for obtaining the raised-edge profile for both front and back reflectors are disclosed in U.S. Pat. No. 8,269,977 issued on Sep. 4, 2012 to Alphonse, and is being incorporated by reference in its entirety.

Broadband High-Power Double-Pass SOA:

The invention as described in the previous section is not limited to light generating optical devices. In one variant embodiment, principles may be incorporated in a light amplification device as well, for example in a semiconductor optical amplifier (SOA). SOA is basically a waveguide device where light from an external source is amplified due to the gain in the medium. A prior art traditional single-pass SOA does not simultaneously have very high gain and low spectral modulation due to the limit on facet reflectivities. While facet reflectivity may be improved by configuring the device using a tilted waveguide semiconductor, the effective facet reflectivities are still limited to a range $10^{-5}$ or $10^{-6}$ after applying an AR coating to the facet, but may not be lowered any further in a prior art device.

Figure 14:
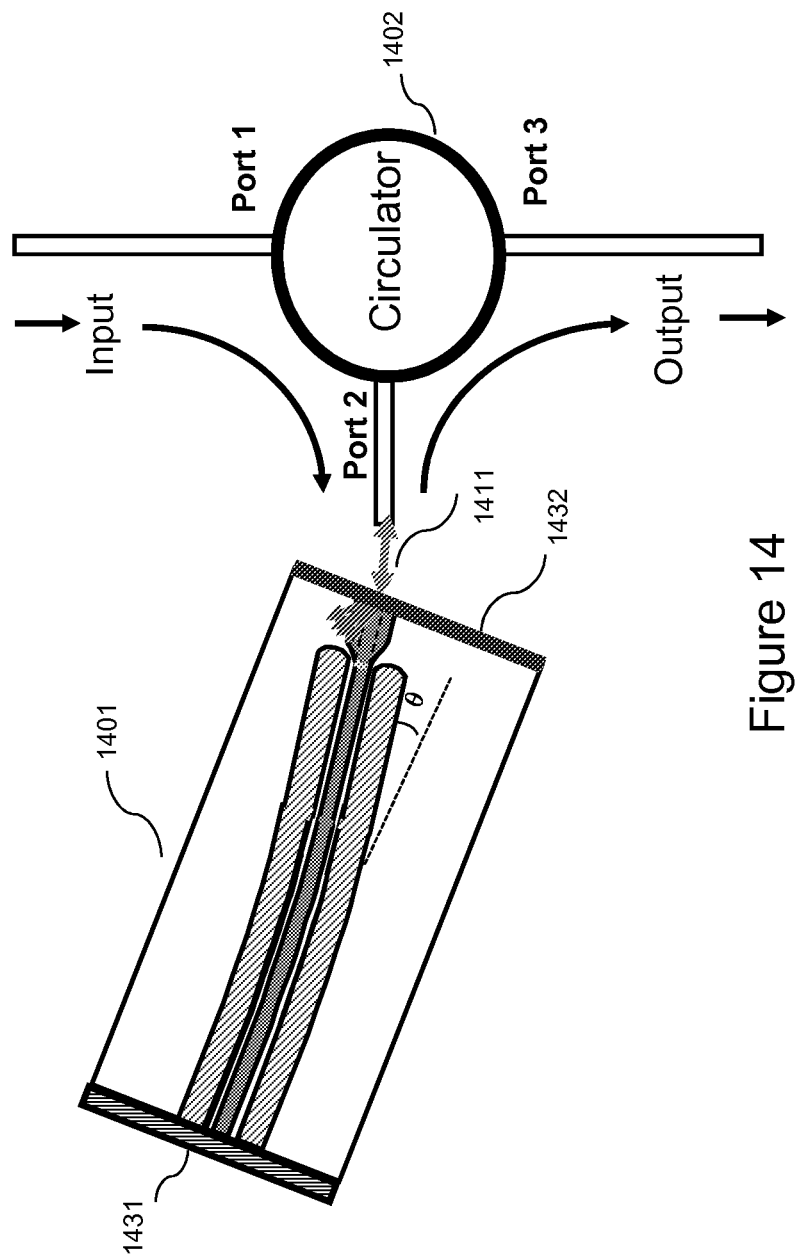
FIG. 14 shows a double-pass semiconductor optical amplifier configured with a circulator for reflection-free input and output ports.

However, a double-pass SLD device constructed according to this invention may be configured as a double-pass SOA. A preferred configuration of a double-pass SOA shown in FIG. 14 comprises a truncated curved waveguide device 1401. For illustrative purpose the waveguide device selected here is similar to the one described in reference to FIG. 11. That description is pertinent to the waveguide device 1401 and will not be repeated. As has been described earlier, reflectivity at the front facet of the truncated curved waveguide may be made negligible ($10^{-10}$ to $10^{-13}$) thereby enabling the device to be operated at higher optical gain and with spectral modulation that may be ≤0.01%, in a double-pass configuration.

More specifically, the waveguide device 1401 is coupled to a three port circulator 1402. In the amplification application, a light to be amplified is provided from an external source at port 1 of the circulator and is coupled to the front facet of a double-pass SOA waveguide through port 2 of the circulator. It may be recalled that the circulator ports are non-reciprocal, so light exiting a port cannot re-enter the same port in the opposite direction. The light is amplified in the double-pass SOA in a similar fashion as described in reference to the double-pass SLD shown in FIGS. 9 and 11. The amplified light exits the waveguide at port 3 of the circulator.

With the truncated waveguide design, a very low front facet reflectivity may be achieved by appropriately selecting the tilt angle and truncation distance as described earlier in reference with FIGS. 6, 7 and 8. Advantageously, the facets 1421 and 1422 may further be coated optionally with suitable optical coatings 1431 and 1432 for providing desired reflectivity properties including a raised-edge reflectivity coating described in reference to FIGS. 10 and 11. For example, a double-pass SOA having a back facet with a raised-edge reflectivity profile similar to the one shown in FIG. 11, constructed according to this invention thereby providing a means to extend the bandwidth as compared to a prior art single-pass SOA. Therefore a double-pass SOA device incorporating the principles of this invention, and in particular, having a truncated curved waveguide makes it a superior device as compared to the state-of-the-art single-pass SOA.

Additional spectral broadening is achieved due to gain saturation effect. Gain saturation stems from the fact that at high level of stimulated emission, a point is reached where current injection cannot provide enough electrons to keep up with stimulated emission, resulting in lower gain at the wavelengths where it occurs. This can occur around the peak of the gain spectrum at high gain. With gain saturation, the spectrum is flattened in its mid-section such as to broaden the 3-dB range. The broadband source can be designed to combine raised-edge reflector broadening with gain saturation such as to further increase the bandwidth beyond the value already provided by the raised-edge back reflector. It is noted that a Gaussian spectrum has no sidebands, but that gain flattening introduces some sidebands in the impulse response of a system. However these sidebands can be made small. For example, the sidebands of the broadened spectrum shown in FIG. 10b would be only just a few percent of the main response.

High Optical Power Sources—Flared and Diamond Waveguides:

In this section a different class of devices where principles of this invention are practiced, will be described. Referring back to FIGS. 9, 11, 12 and 13, the embodiments shown therein comprise waveguide structures that are suitable for coupling light from the source to an external single-mode fiber which limits the waveguide width to be about 2 to 3 µm for wavelengths in the near infrared range. Although the thickness of the active layer in the semiconductor is only a fraction of a micron, the optical mode actually penetrates into the cladding regions to a thickness of about one micron, and therefore the area of the light spot at the facet is of the order of 2 µm² to 3 µm². The maximum available output power is limited by "catastrophic" facet damage caused by heating at power density exceeding about $10^7$ Watts/cm². This limits maximum output power handling capability of those devices to about 300 mW.

Figure 15:
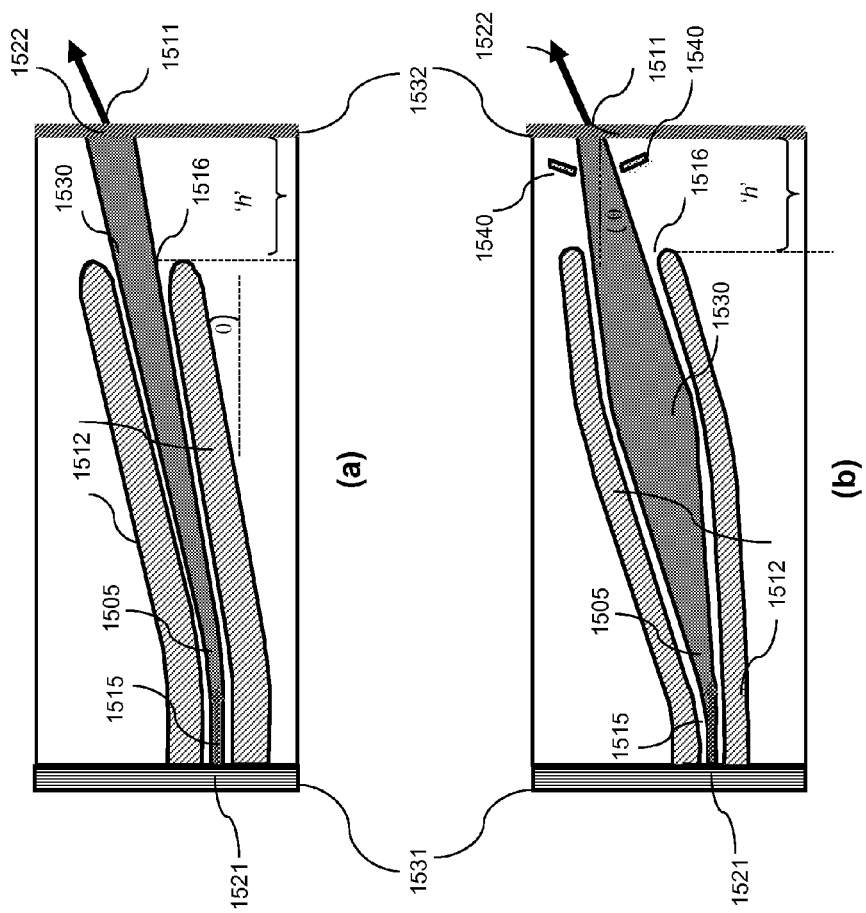
FIG. 15 shows embodiments of a double-pass broadband light source having a) a truncated flared waveguide structure, and b) a truncated diamond waveguide structure.

However, there are applications that require high power without the constraint of single-mode fiber coupling. Achieving higher power requires increasing the area of the light spot at the facet, and since the layer thicknesses are fixed by the growth process, increasing the area can be achieved only by increasing the width of the waveguide along its length and at the facet. FIG. 15a shows an embodiment of a curved ridge waveguide double-pass SLD structure configured for higher output power and bandwidth. By way of example, concept is explained using a ridge waveguide, but the discussion is pertinent to other waveguide structures used for semiconductor optical source.

The basic structure of the waveguide in the embodiment shown in FIG. 15a is very similar to the double-pass SLD described earlier in the context of FIG. 9 except, for the shape of the waveguide. More specifically, the device comprises a curved waveguide including a ridge 1505 positioned between two and channels 1512 placed laterally along the length of the waveguide. One end of the ridge and the channels are placed perpendicular to the back facet 1521 and they curve at an angle θ towards the front facet 1522. In accordance to the concepts developed in this invention, the ridge and channels are terminated or truncated at a distance 'h' from the front facet. The ridge, channel and metal contact layer 1530 are extended adiabatically in a flare towards the front end facet. The light essentially traverses unguided in the adiabatically flared region between the waveguide truncation point and the front end facet 1522. The term "adiabatic" refers to the fact that the flare is so gentle that it broadens the guide without introducing higher order modes. Higher order modes can exist in a waveguide only if the waveguide walls are parallel to each other such as to sustain "transverse resonance".

In the embodiment shown in FIG. 15a, the truncated waveguide structure allows the facet reflectivity at the end of the waveguide (shown as 1516) to be reduced to about $10^{-9}$ or less, by carefully selecting an appropriate combination of the waveguide tilt angle 'θ' and the truncation distance 'h'. Furthermore, optical coatings including reflective coating and AR coating are applied to the back and front end facets 1531 and 1532, respectively. In the exemplary embodiment shown in FIG. 15a, the back facet reflective coating is selected to have a raised-edge reflectivity profile for extended bandwidth. For this exemplary device, an increasing the width of the flare to about 10 µm at the front end facet would allow a single mode to traverse in the output light 1511 and extend the output power capability to about 1 to 1.5 Watts in a single mode.

FIG. 15b shows another embodiment of the curved waveguide double-pass SLD with higher power handling capability. This structure is a double-flare waveguide known in the literature as a "diamond" waveguide disclosed in the U.S. Pat. No. 6,339,606 issued on Jan. 15, 2002 to Alphonse. In this embodiment, the waveguide 1505 (covered by the contact metal region 1530) is shaped like a diamond. More specifically, one end of the waveguide facing the back end facet 1521 is perpendicular to the facet and the other end placed at an angle θ with respect to the front end facet 1522.

Furthermore, channels 1512 placed laterally along the length of the waveguide define the wave guiding section, and are truncated at a distance 'h' from the front end facet which defines the unguided region. Between the two ends the guided area is expanded up to about halfway between the two end facets and then shrunk again until the front end facet. The guided and the unguided sections are deposited with a contact metal layer in a diamond shape. A facet reflectivity at the end of the truncated waveguide (shown as 1516) may be lowered to about $10^{-9}$ or less, by selecting the angle θ and the truncation distance 'h'.

Notably, the width of the guided section near the back end facet is substantially smaller than the width of the contact metal region near the front end facet, thereby preventing catastrophic facet damage at higher output power. The higher power capacity is attributed to the fact that the width of the guide can be fairly large at the waist. In this configuration, much light is generated in the expanding side of the flare, but some of it is filtered out in the contracting side and may escape from the structure, so that only the lowest order mode undergoes gain along the full length of the guide and any higher order mode that is excited in the flare is radiated outside the diamond region.

In the front half of the structure, some of the radiated light outside the ridge may propagate in the same general direction toward the front as the output light. Such light can be deflected out by the optional deflectors 1540 shown near the facet. Raised-edge profile back facet coating 1531 to broaden the bandwidth and AR front facet coating 1532 to reduce the facet reflectivity further. In the embodiment described here, the back facet includes a raised-edge reflectivity profile coating to enhance the bandwidth. However, a non-raised-profile back facet reflector can be used if desired.

Fabrication:

Those skilled in the art will be able to appreciate that central to all the embodiments that were described to illustrate the broader framework of the invention is, a truncated waveguide structure in combination with at least one end of the waveguide being disposed at an angle with respect to the corresponding end facet. A key consequence of the design concept introduced in this invention is to achieve facet reflectivity of about $10^{-9}$ or lower without applying AR coatings. Application of optical coatings including AR coatings or other types of reflective coatings may further lower the facet reflectivity, or modify reflectivity profile to enhance bandwidth. While optical devices comprising semiconductor waveguides existed prior to this invention, none of them incorporated the concepts of this invention.

Most semiconductor waveguides comprise multiple layers of material grown sequentially and then selectively processed different layers to achieve a desired form or structure to provide light guiding effects. While there are different methods well known in the art and may be used to construct waveguide devices including the ones described in this invention, a preferred sequence of constructing the devices is adopted to practice this invention. The sequence adapted here requires very few masking steps to create the required waveguide elements of the device and is therefore simple to implement in a manufacturing environment.

More specifically, the layered structure shown in FIGS. 1b, 3b, 4b and 5b may be grown by standard epitaxial growth methods, such as MOCVD (metal organic chemical vapor deposition) and MBE (molecular beam epitaxy) that are well known in the industry. The choice of method may be determined by the active layer composition for example, a single quantum well or a multiple quantum well, GRINSCH (Graded Index Separate Confinement Heterostructure), etc. The active layer may be a semiconductor layer, a p-n or a p-i-n homojunction or a heterojunction, a single or multiple quantum well structure, a graded index quantum well structure (e.g., GRINSCH), a quantum dot layer separated by appropriate thin buffer layer(s), etc. that are well known in the art as light generating materials and in particular, semiconductor materials exhibiting electroluminescence. The device is processed by the standard photolithography, masking, etching, and vacuum deposition techniques well adapted in the semiconductor industry. Advantageously, only two masks are needed for the fabrication of the exemplary truncated ridge waveguide structure: one for etching the channels, and one for defining the area for contact metal layer.

While there are many different steps that may be adapted to construct a truncated waveguide structure a preferred sequence of constructing a light source is outlined below— a) To Make the Channels:
1. Spin-coating of a UV-sensitive photoresist on the surface of the top;
2. UV exposure through a mask defining the channels. the pattern for the mask is the same as the area shaded with dots shown in FIG. 4a. The mask for the channels is transparent to UV over the whole semiconductor surface, but is opaque to UV in the space of the channels UV exposure polymerizes the photoresist and makes it insoluble, but it can be etched out; and
3. Unexposed regions are soluble in some alcohol. The photoresist is dissolved, leaving the dotted channel areas bare, and the p⁺-cap and p-clad layers are etched to a depth defined by the etch-stop layer (FIGS. 4b and 4c). A different solvent is then used to remove the polymerized photoresist, leaving the whole surface bare, ready for the next step.

b) To Define the p-Contact on the Ridge and the Unguided Region:

1. Evaporate a dielectric material such as $SiO_2$ over the whole semiconductor surface to serve as an insulator;
2. Spin-coating of photoresist over the $SiO_2$;
3. UV exposure through contact mask to define the contact area. This is the area of the dark gray stripe over the ridge and extending to the facet as shown in FIG. 4a. Again, the mask is clear everywhere over the semiconductor surface and opaque to UV in the contact area;
4. The photoresist is dissolved in the contact area that was masked from UV exposure;
5. The $SiO_2$ is etched out using hydrofluoric acid, and the polymerized photoresist is removed. As a result, the whole semiconductor surface is covered with $SiO_2$ except in the contact stripe area;
6. Finally, the whole surface of the semiconductor is metalized on both the p-side and n-side, and the chips are cleaved into bars containing several devices. Although the whole surface is metalized, electric contact is made only to the contact stripe area; and
7. The facets of the bars are coated as for antireflection or reflection as needed, and the bars are diced into chips to make individual devices.

The method and sequence of steps described here are merely for illustrative purposes and should not be construed as limiting. Other methods and sequence of processing the layered waveguide material may occur to those skilled in the art and may be adopted to practice the invention without digressing from the broad framework of the invention illustrated through specific embodiments. Elements shown in each embodiment is merely to illustrate general principles of the invention and are not precluded from being incorporated in other embodiments illustrated here, or any variations, combinations and sub combinations that may occur to those skilled in the art. The real scope of the invention lies in what is presented in the following claims.

What is claimed is:

1. A light source comprising:
    a light generating medium having two ends terminating in corresponding end facets, said light generating medium further including;
    a waveguide having a first end disposed at an angle with respect to the normal to a first end facet, said first end of the waveguide is terminated at a predetermined distance prior to reaching said first end facet, said termination facilitated by terminating lateral confinement on both sides along the length of the waveguide, such that the light generated within the light generating medium, is laterally guided in the waveguide, and is substantially unguided without attenuation, between the first end of the waveguide and said first end facet;
    wherein, said angle and said predetermined distance are selected in prescribed combinations, such that only a small component of the light reflected from the first end facet is intercepted in the waveguide; and
    wherein a second opposite end of the waveguide is disposed at a corresponding second end facet in accordance with a pre-determined design, such that upon pumping the light generating medium, an optical path between the two end facets allows light to traverse in one or more passes through the waveguide, and exhibits optical gain in the light generating medium in the waveguide and in the region between the first end of the waveguide and said first end facet.

2. The light source as in claim 1, wherein the waveguide width, refractive index and the refractive index difference between the waveguide and the lateral confinement is selected according to a prescribed criterion to support a single mode transmission in the waveguide and in the region between the first end of the waveguide and said first end facet.

3. The light source as in claim 1 where an electrical contact to the waveguide is disposed on the waveguide surface contiguously between the first and second end facets, such that the light generating medium in the waveguide and in the region between the first end of the waveguide and said first end facet is electrically pumped.

4. The light source as in claim 3, wherein the electrical contact is widened between the first end of the waveguide and the first end facet.

5. The light source as in claim 1, wherein the second opposite end of the waveguide disposed at an angle is terminated at a predetermined distance prior to reaching the second end facet, so as to allow light traversing between the second terminated end of the waveguide and the second end facet, to be substantially unguided, and wherein, said angle and said distance are selected in prescribed combinations, such that the fraction of the light reflected from the second end facet and intercepted in the waveguide is less than or equal to $10^{-9}$.

6. The light source as in claim 1, wherein the second opposite end of the waveguide is disposed perpendicular to a normal to the second end facet to configure a curved waveguide having a radius of curvature determined according to a prescribed criterion to minimize radiation loss at the curve, such that a pre-determined fraction of light reaching the second end facet is reflected back into the waveguide to support optical gain in a single mode such that the light source is configured to operate as a double-pass light source that is one selected from a group consisting of a Super Luminescent Diode, and a Semiconductor Optical Amplifier.

7. The light source as in claim 1, wherein the waveguide is a tilted waveguide with the second opposite end of the waveguide disposed at an angle with respect to a normal to the second end facet.

8. The light source as in claim 7, wherein an electrical contact to the waveguide is disposed on the waveguide surface contiguously between the first and second end facets, and wherein said electrical contact is widened between the first end of the waveguide and the first end facet, such that the light generating medium in the waveguide and in the region between the first end of the waveguide and said first end facet is electrically pumped.

9. The light source as in claim 8 further including:
    a reflective coating on the second end facet so as to partially reflect a predetermined fraction of the light from the second end facet back in to the waveguide; and
    an external reflector placed to receive output light emitted at the first end facet so as to configure a reflective cavity between the external reflector and the second end facet, such that light emission at the second end facet exhibits a plurality of discrete spectral lines.

10. The light source as in claim 9, wherein the reflective coating exhibits a reflectivity spectral profile having higher reflectivity at band edges of the gain profile of the light generating medium for extending the bandwidth of the output light.

11. The light source as in claim 5, wherein the electrical contact through the waveguide is disposed on the waveguide surface contiguously between the first and second facets to electrically pump the light generating medium and is widened between the terminated first and second ends of the waveguide and respective first and second end facets, so as to configure a single-pass Super Luminescent Diode exhibiting negligible spectral modulation in the output light.

12. The light source as in claim 1, wherein the light generating medium comprises a multi-layer semiconductor structure.

13. The light source as in claim 1, wherein the waveguide is configured as a ridge waveguide defined by etching two channels positioned on either side of the ridge along the length of the waveguide, and wherein the depth of the channel is selected to provide a prescribed refractive index step, such that the light traversing in the waveguide is laterally confined in the ridge.

14. The light source as in claim 13, wherein termination of the waveguide is effected through terminating the two channels at a predetermined distance prior to reaching the first end facet.

15. The light source as in claim 13, wherein light in the waveguide is generated in an active layer including the light generating medium in the ridge, said active layer is one selected from a group consisting of a semiconductor layer, a p-n or a p-i-n homojunction, a heterojunction, a single quantum well, a multiple quantum well structure, a graded index quantum well structure (e.g., GRINSCH), and a quantum dot layer separated by appropriate thin buffer layer(s).

16. The light source as in claim 1 further including coatings deposited on the first and second end facets according to pre-determined selection criteria, to provide a desired reflectivity spectral profile that is one selected from a group consisting of a flat antireflection, a flat reflection, a raised-edge reflectivity profile or a combination thereof.

17. The light source as in claim 1, wherein the waveguide is a dielectric waveguide including an optical fiber.

18. A double-pass light source comprising:
a multi-layer semiconductor light generating medium capable of producing optical gain, said light generating medium including two ends terminating in corresponding end facets, said light generating medium further including;
a single mode waveguide including,
a first end disposed at an angle with respect to the normal to a first end facet, said first end of the waveguide is terminated at a predetermined distance prior to reaching said first end facet, said termination facilitated by terminating lateral confinement on both sides along the length of the waveguide, wherein the waveguide width, refractive index and the refractive index difference between the waveguide and the lateral confinement are selected according to a prescribed criterion, such that light generated within the light generating medium is laterally guided in the waveguide and is substantially unguided without attenuation between the first end of the waveguide and said first end facet, and wherein said angle and said predetermined distance are selected in prescribed combinations, such that only a small component of the light reflected from the first end facet is intercepted in the waveguide, and a second opposite end of the waveguide is disposed substantially perpendicular to the normal to a corresponding second end facet to provide a reflective surface having reflectivity higher than said first end facet, so as to reflect a pre-determined portion of the light reaching the second end facet into the waveguide, such that upon pumping the light generating medium in the waveguide and between the first end of the waveguide and said first end facet, the light traversing in the waveguide is emitted in a single mode at the first end facet after at least two passes in the waveguide.

19. The light source as in claim 18, wherein
the lateral confinement of light in the waveguide is in a ridge created by etching channels to a predetermined depth to provide a prescribed refractive index step on either side of the ridge along the length of the waveguide,
termination of the first end of the waveguide is effected by terminating the channels at a predetermined distance prior to reaching the first end facet, and
said active layer is one selected from a group consisting a semiconductor layer, a p-n or a p-i-n homojunction, a heterojunction, a single quantum well, a multiple quantum well structure, a graded index quantum well structure (e.g., GRINSCH), a quantum dot layer separated by appropriate thin buffer layer(s).

20. The light source in claim 18, wherein an electrical contact to the waveguide is disposed on the waveguide surface between the first and second end facets, and wherein said electrical contact is widened between the first end of the waveguide terminated at an angle, and the first end facet, to electrically pump the light generating medium in the waveguide and in the region between the first end of the waveguide and said first end facet.

21. The light source as in claim 18 further including optical coatings deposited on the first and second end facets according to pre-determined selection criteria, to provide a desired reflectivity spectral profile that is one selected from a group consisting of, a flat antireflection, a flat high reflection, a raised-edge reflectivity profile and a combination thereof.

22. The light source as in claim 18, wherein the second end facet includes an optical coating exhibiting a reflectivity spectral profile having higher reflectivity at band edges of the gain profile of light generating medium to offset roll-off at the edges of said gain profile, so as to extend the bandwidth of the output light.

23. The light source as in claim 18 further including a circulator placed at the first end facet to configure a double-pass Semiconductor Optical Amplifier exhibiting negligible spectral modulation in the amplified output light.

24. The light source as in claim 18, wherein the waveguide is a double-flare diamond shaped waveguide including an electrical contact disposed on the surface of the waveguide between the first and second end facets, and wherein the electrical contact is reduced between the terminated end of the waveguide and the first end facet.

* * * * *